United States Patent
Ishizu et al.

(10) Patent No.: US 9,388,337 B2
(45) Date of Patent: Jul. 12, 2016

(54) METAL FLUORIDE CRYSTAL, LIGHT EMITTING ELEMENT, SCINTILLATOR, METHOD OF DETECTING NEUTRON, AND METHOD OF PRODUCING METAL FLUORIDE CRYSTAL

(71) Applicants: Tohoku University, Miyagi (JP); Tokuyama Corporation, Yamaguchi (JP)

(72) Inventors: Sumito Ishizu, Yamaguchi (JP); Kentaro Fukuda, Yamaguchi (JP); Noriaki Kawaguchi, Yamaguchi (JP); Akira Yoshikawa, Miyagi (JP); Takayuki Yanagida, Miyagi (JP); Yui Yokota, Miyagi (JP); Yutaka Fujimoto, Miyagi (JP)

(73) Assignees: TOKUYAMA CORPORATION, Yamaguchi (JP); TOHOKU UNIVERSITY, Miyagi (JP)

( * ) Notice: Subject to any disclaimer, the term of this patent is extended or adjusted under 35 U.S.C. 154(b) by 6 days.

(21) Appl. No.: 14/396,584

(22) PCT Filed: Apr. 18, 2013

(86) PCT No.: PCT/JP2013/002620
§ 371 (c)(1),
(2) Date: Oct. 23, 2014

(87) PCT Pub. No.: WO2013/161227
PCT Pub. Date: Oct. 31, 2013

(65) Prior Publication Data
US 2015/0115168 A1    Apr. 30, 2015

(30) Foreign Application Priority Data
Apr. 26, 2012 (JP) ................. 2012-101631

(51) Int. Cl.
*G01T 3/00*    (2006.01)
*C09K 11/77*    (2006.01)
(Continued)

(52) U.S. Cl.
CPC ............. *C09K 11/7733* (2013.01); *C30B 15/08* (2013.01); *C30B 29/12* (2013.01); *G01T 3/06* (2013.01); *G21K 4/00* (2013.01)

(58) Field of Classification Search
CPC ...... G01T 1/202; G01T 3/06; C09K 11/7733; C30B 15/08; C30B 29/12
USPC ........................................................ 250/391
See application file for complete search history.

(56) References Cited

U.S. PATENT DOCUMENTS 6,635,523 B1 * 10/2003 Uchiyama et al. ............. 438/239
2006/0244366 A1 * 11/2006 Sasakura et al. ............... 313/503
(Continued)

FOREIGN PATENT DOCUMENTS

JP    2010-280543 A    12/2010
WO    WO-2004/086089 A1    10/2004
(Continued)

OTHER PUBLICATIONS

A. Yamaji, Czochralski growth and neutron response properties of Eu, Na co-doped LiCaAlF6, Extended Abstracts, Japan Society of Applied Physics and Related Societies Dai 59 Kai, The Japan Society of Applied Physics, Mar. 18, 2012, 15-002. (English translation).
(Continued)

*Primary Examiner* — David Porta
*Assistant Examiner* — Abra Fein
(74) *Attorney, Agent, or Firm* — Saliwanchik, Lloyd & Eisenschenk

(57) ABSTRACT

A light emitting element according to one embodiment of the present invention is configured of a metal fluoride crystal which is represented by chemical formula LiM1M2F6 (wherein Li includes 6Li; M1 represents at least one alkaline earth metal element selected from among Mg, Ca, Sr and Ba; and M2 represents at least one metal element selected from among Al, Ga and Sc), said metal fluoride crystal containing 0.02% by mole or more of Eu and having an Eu2+ concentration of less than 0.01% by mole.

9 Claims, 18 Drawing Sheets

(51) Int. Cl.
*C30B 29/12* (2006.01)
*C30B 15/08* (2006.01)
*G21K 4/00* (2006.01)
*G01T 3/06* (2006.01)

(56) References Cited

U.S. PATENT DOCUMENTS

2010/0033074 A1* 2/2010 Nakakawaji et al. ......... 313/483
2010/0314550 A1* 12/2010 Yoshikawa et al. ...... 250/390.11

FOREIGN PATENT DOCUMENTS

| WO | WO-2009/028640 A1 | 3/2009 |
| WO | WO-2009/119378 A1 | 10/2009 |
| WO | WO-2012/060382 A1 | 5/2012 |

OTHER PUBLICATIONS

N. Kawaguchi, Trapped-exciton level in Eu:LiCaALF6 scintillator, Extended Abstracts, Japan Society of Applied Physics and Related Societies Dai 59 Kai, The Japan Society of Applied Physics, Mar. 18, 2012, 02-014. (English translation).

A. Yamaji, Czochralski growth and neutron response properties of Eu, Na co-doped LiCaALF6, Extended Abstracts, Japan Society of Applied Physics and Related Societies Dai 59 Kai, The Japan Society of Applied Physics, Mar. 18, 2012, 15-002.

N. Kawaguchi, Trapped-exciton level in Eu:LiCaALF6 scintillator, Extended Abstracts, Japan Society of Applied Physics and Related Societies Dai 59 Kai, The Japan Society of Applied Physics, Mar. 18, 2012, 02-014.

T. Yanagida, Europium and Sodium Codoped LiCaALF6 Scintillator for Neutron Detection, Applied Physics Express, Sep. 26, 2011, vol. 4, 106401-1.

International Search Report in International Application No. PCT/JP2013/002620, filed Apr. 18, 2013.

* cited by examiner

METAL FLUORIDE CRYSTAL, LIGHT EMITTING ELEMENT, SCINTILLATOR, METHOD OF DETECTING NEUTRON, AND METHOD OF PRODUCING METAL FLUORIDE CRYSTAL

CROSS-REFERENCE TO RELATED APPLICATIONS

This application is the U.S. national stage application of International Patent Application No. PCT/JP2013/002620, filed Apr. 18, 2013, which claims priority to Japanese Application No. 2012-101631, filed Apr. 26, 2012, the disclosures of each of which are incorporated herein by reference in their entirety.

TECHNICAL FIELD

The present invention is related to a new metal fluoride crystal, a method of producing the same, a light emitting element including the crystal, and a method of detecting a neutron using the crystal, and, more specifically, to a metal fluoride crystal that is useful as a neutron scintillator and a light emitting element.

BACKGROUND ART

The metal fluoride crystal is a metal compound crystal that is expected for various applications. For example, a single crystal such as a calcium fluoride and a magnesium fluoride has a high permeability, a low refractive index, and a low dispersion over a wide range of wavelength band from vacuum ultraviolet to infrared, and has excellent chemical stability. Therefore, such a single crystal is used for a window material, a lens, a prism, and the like, as an optical material in a wide range of areas. In particular, the single crystal is expected as a window material, a light source system lens, an illumination system lens, and a projection system lens of an apparatus such as an ArF laser (193 nm) and a stepper that uses an F2 laser (157 nm) light source (reduction projection exposure apparatus) developed as a next-generation short wavelength light source in an optical lithography technique.

A lithium calcium aluminum fluoride (hereinafter, referred to also as LiCAF) single crystal is a crystal that is widely used as a laser oscillation element, and a laser oscillation element to which a dopant such as a cerium (Ce) element is added has been known (Patent Document 1).

On the other hand, the metal fluoride crystal has been developed as a neutron scintillator used for a neutron detector. For example, a neutron scintillator in which a europium (Eu) element is added to a LiCAF single crystal has been known (Patent Document 2). The neutron scintillator is a substance that absorbs a neutron to emit fluorescence when the neutron collides with the neutron scintillator.

Various types of performance of a neutron detector that uses a scintillator, the detection efficiency and count rate for a neutron, and the discrimination ability for a neutron and a γ-ray (hereinafter, referred to also as n/γ discrimination ability) depend on a substance constituting the scintillator. The light emission intensity of the scintillator affects the detection efficiency. The speed of attenuation of fluorescence affects the count rate. It should be noted that the detection efficiency represents a ratio of the number of radiation counted by a detector to the number of radiation that is emitted from a radiation source and enters the detector, and the count rate represents the number of radiation counted in a unit time.

CITATION LIST

Patent Document

Patent Document 1: Japanese Patent Application Laid-open No. 2010-280543
Patent Document 2: WO2009/119378

DISCLOSURE OF THE INVENTION

Problem to be Solved by the Invention

In recent years, the detection efficiency for a neutron of a scintillator, the discrimination ability for a neutron and a γ-ray, or the like is expected to be further improved. In order improve the detection efficiency, it is essential to increase the amount of light emission of a metal fluoride crystal. In order to improve the discrimination ability, a high sensitivity to a neutron ray and a low sensitivity to a γ-ray are demanded.

In view of the circumstances as described above, it is an object of the present invention to provide a metal fluoride crystal having a large amount of light emission, a method of producing the same, a light emitting element, a scintillator, and a method of detecting a neutron using the metal fluoride crystal.

Means for Solving the Problem

In order to achieve the above-mentioned object, a metal fluoride crystal according to an embodiment of the present invention is a metal fluoride crystal including a crystal represented by a chemical formula $LiM^1M^2F_6$ (in the formula, Li includes $^6Li$, $M^1$ represents at least one kind of alkaline earth metal element selected from the group consisting of Mg, Ca, Sr, and Ba, and $M^2$ represents at least one kind of metal element selected from the group consisting of Al, Ga, and Sc), the crystal containing not less than 0.02 mol % of Eu, the crystal having a concentration of $Eu^{2+}$ of less than 0.01 mol %.

A light emitting element according to an embodiment of the present invention includes a metal fluoride crystal including a crystal represented by a chemical formula $LiM^1M^2F_6$ (in the formula, Li includes $^6Li$, $M^1$ represents at least one kind of alkaline earth metal element selected from the group consisting of Mg, Ca, Sr, and Ba, and $M^2$ represents at least one kind of metal element selected from the group consisting of Al, Ga, and Sc), the crystal containing not less than 0.02 mol % of Eu, the crystal having a concentration of $Eu^{2+}$ of less than 0.01 mol %.

A scintillator according to an embodiment of the present invention includes a metal fluoride crystal including a crystal represented by a chemical formula $LiM^1M^2F_6$ (in the formula, Li includes $^6Li$, $M^1$ represents at least one kind of alkaline earth metal element selected from the group consisting of Mg, Ca, Sr, and Ba, and $M^2$ represents at least one kind of metal element selected from the group consisting of Al, Ga, and Sc), the crystal containing not less than 0.02 mol % of Eu, the crystal having a concentration of $Eu^{2+}$ of less than 0.01 mol %.

A method of detecting a neutron according to an embodiment of the present invention includes preparing a metal fluoride crystal including a crystal represented by a chemical formula $LiM^1M^2F_6$ (in the formula, Li includes $^6Li$, $M^1$ represents at least one kind of alkaline earth metal element selected from the group consisting of Mg, Ca, Sr, and Ba, and $M^2$ represents at least one kind of metal element selected from the group consisting of Al, Ga, and Sc), the crystal containing not less than 0.02 mol % of Eu, the crystal having a concentration of Eu2+ of less than 0.01 mol %.

An electron-hole pair is generated in the metal fluoride crystal by capturing a neutron applied to the metal fluoride crystal with a $^6$Li isotope in the metal fluoride crystal.

$Eu^{2+}$ is excited with an electron generated in the metal fluoride crystal.

The neutron applied to the metal fluoride crystal is detected by detecting light emission derived from the excited $Eu^{2+}$ with a light detector.

A method of producing a metal fluoride crystal according to an embodiment of the present invention includes melting a mixed raw material including an Li-source raw material containing $^6$Li, an alkaline earth metal-source raw material, a metal element-source material, and a Eu-source raw material. A metal fluoride crystal including a crystal represented by a chemical formula $LiM^1M^2F_6$ (in the formula, Li includes $^6$Li, $M^1$ represents at least one kind of alkaline earth metal element selected from the group consisting of Mg, Ca, Sr, and Ba, and $M^2$ represents at least one kind of metal element selected from the group consisting of Al, Ga, and Sc) is grown from melt of the mixed raw material in an atmosphere containing a fluorine-source gas broken in a growth atmosphere, the crystal containing not less than 0.02 mol % of Eu, the crystal having a concentration of Eu2+ of less than 0.01 mol %.

A method of producing a metal fluoride crystal according to another embodiment of the present invention includes melting a mixed raw material including an Li-source raw material containing $^6$Li, an alkaline earth metal-source raw material, a metal element-source material, a Eu-source raw material, and at least one kind of alkali metal-source raw material selected from the group consisting of a sodium fluoride, a potassium fluoride, a rubidium fluoride, and a cesium fluoride.

A metal fluoride crystal including a crystal represented by a chemical formula $LiM^1M^2F_6$ (in the formula, Li includes $^6$Li, $M^1$ represents at least one kind of alkaline earth metal element selected from the group consisting of Mg, Ca, Sr, and Ba, and $M^2$ represents at least one kind of metal element selected from the group consisting of Al, Ga, and Sc) is grown from melt of the mixed raw material in an atmosphere containing a fluorine-source gas broken in a growth atmosphere, the crystal containing not less than 0.02 mol % of Eu, the crystal having a concentration of Eu2+ of less than 0.01 mol %.

MODE(S) FOR CARRYING OUT THE INVENTION

In the LiCAF crystal to which europium (Eu) is added, because a europium fluoride can be in a stable divalent or trivalent oxidation state, it has been found that Eu in the crystal includes only divalent and trivalent europium ($Eu^{2+}$, $Eu^{3+}$) substantially. Out of these, only light emission of $Eu^{2+}$ is used for detecting a neutron.

Figure 1:
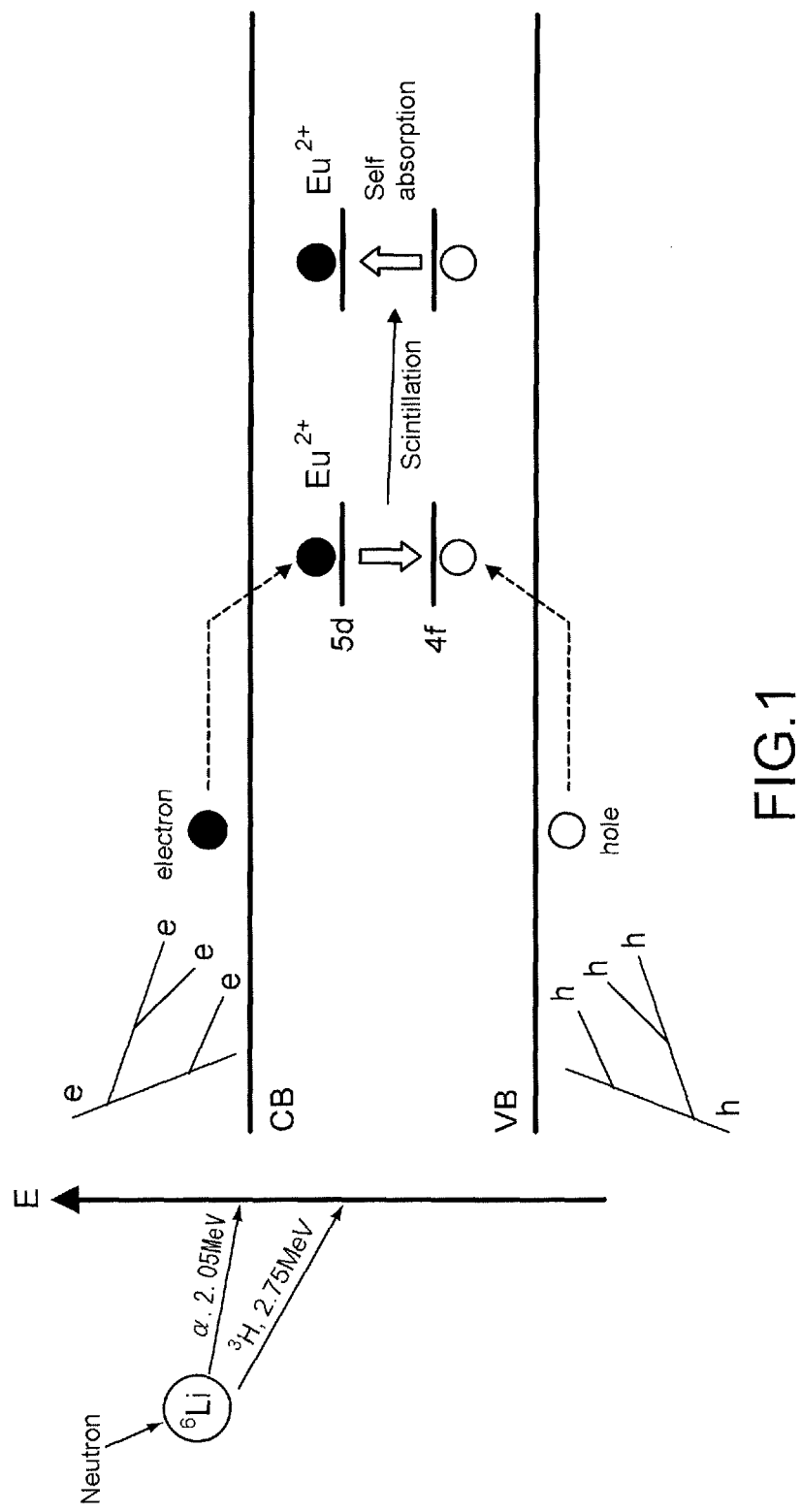
FIG. 1 A schematic diagram for explaining a self-absorption mechanism for scintillation light of a Eu-doped LiCAF crystal.

FIG. 1 is a schematic diagram showing a light emission principle of a Eu-doped LiCAF crystal. In the figure, CB represents the conduction band of the crystal, VB represents the valance band of the crystal, and 5d and 4f represent the electron orbit of $Eu^{2+}$. When a neutron enters a metal fluoride crystal, the neutron is captured by a $^6$Li isotope in the metal fluoride crystal and a capture reaction occurs to generate an α particle being a secondary particle and tritium ($^3$H). Next, such a secondary particle migrates several ten μm in the crystal, and an electron-hole pair is generated in the crystal. At this time, $Eu^{2+}$ is excited to emit scintillation light.

However, there has been a problem that, because $Eu^{2+}$ in the LiCAF crystal has a small Stokes shift and the absorption wavelength and light emission wavelength are close to each other, light emission of $Eu^{2+}$ obtained by irradiation of a neutron ray is self-absorbed by $Eu^{2+}$, and the net amount of obtained light emission decreases, which leads to deterioration of detection efficiency. Such a problem has significant effects in the case where the scintillator is increased in size or where the concentration of Eu is increased. Such a problem with increase in the size of the scintillator or increase in the concentration of Eu cannot be solved by the currently well-known LiCAF to which Eu is added, and a material that has low self-absorption and shows a large amount of light emission is desired.

In view of the above, the present inventors examined various conditions for making a metal fluoride crystal contain Eu being a dopant, or the like. As a result, they succeeded in creating a crystal that preferentially contained $Eu^{3+}$ therein by causing a specific alkali metal element to coexist in the crystal. In the case where the concentration of Eu is constant, the crystal has a lower concentration of $Eu^{2+}$ and a higher concentration of $Eu^{3+}$ than the existing crystals. In addition, the present inventors found that the self-absorption decreased because the crystal had a low concentration of $Eu^{2+}$, and the amount of light emission based on $Eu^{2+}$ was large regardless of the low concentration of $Eu^{2+}$, and completed the present invention.

Specifically, in an embodiment of the present invention, provided is a metal fluoride crystal including a crystal represented by the chemical formula $LiM^1M^2F_6$ (in the formula, $M^1$ represents at least one kind of alkaline earth metal element selected from the group consisting of Mg, Ca, Sr, and Ba, and $M^2$ represents at least one kind of metal element selected from the group consisting of Al, Ga, and Sc) the crystal containing not less than 0.02 mol % of Eu, the crystal having a concentration of $Eu^{2+}$ of less than 0.01 mol %.

In addition, a light emitting element according to an embodiment of the present invention includes a metal fluoride crystal including a crystal represented by the chemical formula $LiM^1M^2F_6$ (in the formula, Li includes $^6Li$, $M^1$ represents at least one kind of alkaline earth metal element selected from the group consisting of Mg, Ca, Sr, and Ba, and $M^2$ represents at least one kind of metal element selected from the group consisting of Al, Ga, and Sc), the crystal containing not less than 0.02 mol % of Eu, the crystal having a concentration of $Eu^{2+}$ of less than 0.01 mol %.

In addition, a scintillator according to an embodiment of the present invention includes a metal fluoride crystal including a crystal represented by the chemical formula $LiM^1M^2F_6$ (in the formula, Li includes $^6Li$, $M^1$ represents at least one kind of alkaline earth metal element selected from the group consisting of Mg, Ca, Sr, and Ba, and $M^2$ represents at least one kind of metal element selected from the group consisting of Al, Ga, and Sc), the crystal containing not less than 0.02 mol % of Eu, the crystal having a concentration of $Eu^{2+}$ of less than 0.01 mol %.

The fundamental configuration (mother crystal) of the metal fluoride crystal is a crystal of a metal fluoride including a lithium element, an alkaline earth metal element, and a metal element, and the crystal contains europium (Eu) as a dopant therein. Specifically, the metal fluoride crystal according to this embodiment is represented by the chemical formula $LiM^1M^2F_6$ (in the formula, $M^1$ represents at least one kind of alkaline earth metal element selected from the group consisting of Mg, Ca, Sr, and Ba, and $M^2$ represents at least one kind of metal element selected from the group consisting of Al, Ga, and Sc), the crystal containing not less than 0.02 mol % of Eu, the crystal having a concentration of $Eu^{2+}$ of less than 0.01 mol %.

The mother crystal of the metal fluoride crystal is a crystal of a metal fluoride represented by the chemical formula $LiM^1M^2F_6$ (in the formula, $M^1$ represents at least one kind of alkaline earth metal element selected from the group consisting of Mg, Ca, Sr, and Ba, and $M^2$ represents at least one kind of metal element selected from the group consisting of Al, Ga, and Sc), and the metal fluoride crystal is clear and colorless and belongs to a hexagonal system crystal. The crystal has favorable chemical stability and no degradation of performance in a short period of time is recognized in normal use. It has favorable mechanical strength and processability and can be processed in a desired shape and used.

In the above-mentioned chemical formula, $M^1$ represents magnesium, calcium, strontium, or barium, and $M^2$ represents aluminum, gallium, or scandium.

Specific example of the mother crystal include a lithium calcium aluminum fluoride ($LiCaAlF_6$), a lithium strontium aluminum fluoride —($LiSrAlF_6$), a lithium magnesium aluminum fluoride ($LiMgAlF_6$), and a lithium calcium gallium fluoride ($LiCaGaF_6$). The lithium calcium aluminum fluoride ($LiCaAlF_6$) is favorable in that it has a small average atomic weight, a low sensitivity to a γ-ray, a closer ion radius to Eu, and a site that can be easily replaced.

In the metal fluoride crystal, it is favorable to make the ratio of a $^6Li$ isotope to Li elements contained in the crystal be not less than 50%. By making the ratio of a $^6Li$ isotope be not less than 50%, the probability of the capture reaction of a neutron is increased and the detection efficiency for a neutron is improved.

In the metal fluoride crystal, Eu contained in the crystal may include $Eu^{3+}$ having a higher concentration than $Eu^{2+}$. In the metal fluoride crystal according to this embodiment, the content of Eu is not less than 0.02 mol % with $LiM^1M^2F_6$ as a reference, and the concentration of $Eu^{2+}$ is less than 0.01 mol %. Eu existed in the metal fluoride crystal according to this embodiment is $Eu^{2+}$ or $Eu^{3+}$, and the total amount of $Eu^{2+}$ and $Eu^{3+}$ occupies not less than 99.9% of Eu. Therefore, in the case where the concentration of Eu is constant, a low concentration of $Eu^{2+}$ represents a high concentration of $Eu^{3+}$.

On the other hand, a method of detecting a neutron according to an embodiment of the present invention includes preparing a metal fluoride crystal including a crystal represented by the chemical formula $LiM^1M^2F_6$ (in the formula, Li includes $^6Li$, $M^1$ represents at least one kind of alkaline earth metal element selected from the group consisting of Mg, Ca, Sr, and Ba, and $M^2$ represents at least one kind of metal element selected from the group consisting of Al, Ga, and Sc), the crystal containing not less than 0.02 mol % of Eu, the crystal having a concentration of $Eu^{2+}$ of less than 0.01 mol %.

By capturing a neutron applied to the metal fluoride crystal with a $^6Li$ isotope in the metal fluoride crystal, an electron-hole pair is generated in the metal fluoride crystal.

$Eu^{2+}$ is excited by the electron generated in the metal fluoride crystal.

By detecting light emission derived from the excited $Eu^{2+}$ with a light detector, the neutron applied to the metal fluoride crystal is detected.

Figure 2:
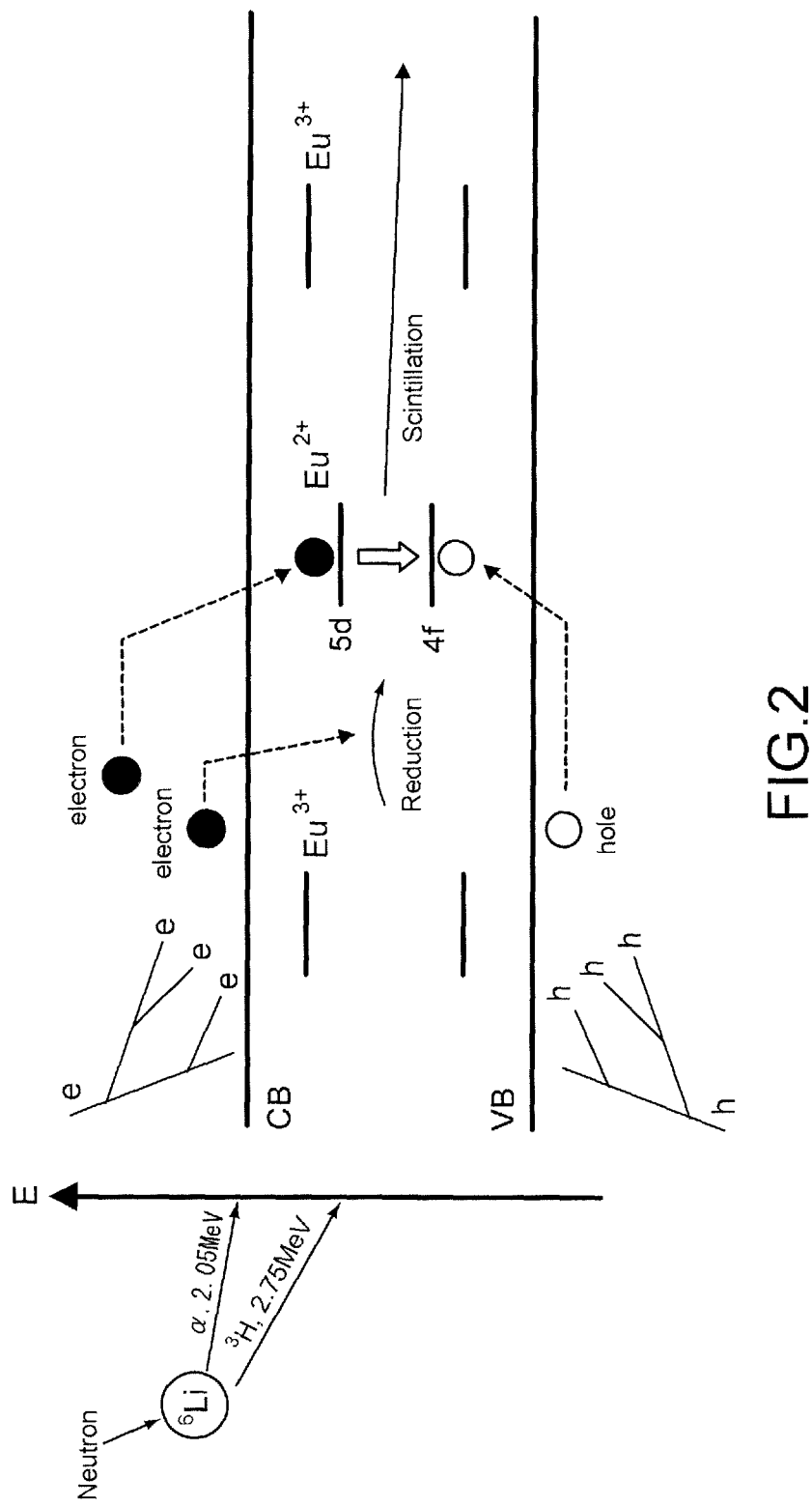
FIG. 2 A schematic diagram for explaining a light emission principle of a metal fluoride crystal according to an embodiment of the present invention.

Although the light emission of $Eu^{2+}$ is as described above, also $Eu^{3+}$ contributes to light emission and the mechanism thereof is as follows. As shown in FIG. 2, when a neutron enters a metal fluoride crystal, the neutron is captured with a $^6Li$ isotope in the metal fluoride crystal and a capture reaction occurs to generate an a particle being a secondary particle and tritium ($^3H$). Next, such a secondary particle migrates several ten μm in the crystal, and an electron-hole pair is generated in the crystal. At this time, if $Eu^{3+}$ exists in the vicinity thereof, $Eu^{3+}$ is reduced to $Eu^{2+}$ by the generated electron. The $Eu^{2+}$ is excited to emit scintillation light. The generated $Eu^{2+}$ is eventually oxidized to $Eu^{3+}$ by the electron hole. Specifically, the metal fluoride crystal according to this embodiment (mother crystal) and divalent europium and trivalent europium act as a neutron capturing material and a phosphor that emits scintillation light, respectively.

If the concentration of $Eu^{2+}$ is less than 0.01 mol %, the effect of self-absorption by $Eu^{2+}$ is small and light emission with a high brightness can be obtained as the content of Eu to the mother crystal of $LiM^1M^2F_6$ increases. In the case where the content of Eu is less than 0.02 mol %, the amount as a phosphor is small and a sufficient amount of light emission cannot be obtained. Moreover, the content of Eu is favorably not more than 5 mol %. By making the content of Eu be not more than 5 mol %, crack is not likely to occur in the crystal and transparency in the ultraviolet area increases. However, in the case where the content is too large, an adverse effect such as that crack is likely to occur in the crystal occurs. It should be noted that the doped Eu is considered to exist between the mother crystal grid or exist by being replaced with an alkaline-earth element. However, the accurate existing state is not clear.

In the case where not less than 0.01 mol % of $Eu^{2+}$ is contained, the effect of self-absorption of $Eu^{2+}$ is large and light emission cannot be detected effectively even if the concentration of Eu is not less than 0.02 mol %. If the effect of self-absorption is considered, the content of $Eu^{2+}$ is favorably not more than 0.005 mol %, more favorably, not more than 0.001 mol %.

On the other hand, in the metal fluoride crystal, the discrimination ability between a neutron and a γ-ray is improved. The estimated improvement mechanism of the discrimination ability is as follows. When a γ-ray enters the metal fluoride crystal, an electron migrates in the crystal. However, the energy of the electron is 1 MeV at most, and the migration distance is several mm, which are lower and longer than the energy (about 4.8 MeV) and the migration distance (several ten μm) of a secondary particle generated when the neutron enters, respectively. Therefore, the density (excitation density) of the electron generated in the crystal by the incident γ-ray is significantly lower than the density (excitation density) of the electrode generated in the crystal by the incident neutron. Accordingly, even if the reduction of $Eu^{3+}$ to $Eu^{2+}$ occurs by the electron, it becomes difficult to reach light emission (scintillation) by the excitation of $Eu^{2+}$. As a result, the light emission due to the incident γ-ray is suppressed, and the sensitivity to the γ-ray is reduced, which improves the n/γ discrimination ability.

As described above, according to this embodiment, it is possible to provide a neutron scintillator that has a high permeability and a large amount of light emission for ultraviolet visible light, a high detection efficiency for a neutron, and an excellent n/γ discrimination ability. With the high permeability, it is possible to effectively use light emission caused due to the irradiation of a neutron ray. This is effective particularly in the case where a large scintillator is used, and it is possible to suppress the decrease in the amount of light emission with increase in the size of a scintillator, which cannot be avoided in the existing crystal. With the properties of the large amount of light emission and the high detection efficiency, it is possible to perform measurement even if the amount of neutron is small. With the excellent n/γ discrimination ability, it is possible to reduce the effect of a γ-ray that may be emitted with a neutron ray, and to perform measurement with a high S/N ratio. A neutron detector using such a neutron scintillator can be favorably used in an academic study field such as structural analysis with neutron diffraction, a non-destructive inspection field, a security field such as cargo inspection, or the like.

The metal fluoride crystal according to this embodiment may contain at least one kind of alkali metal element selected from the group consisting of Na, K, Rb, and Cs, in addition to an Eu element. The addition of an alkali metal element makes the concentration of $Eu^{2+}$ in the crystal low and the concentration of $Eu^{3+}$ high as compared with the case where it is not added. As the alkali metal element, at least one kind of element selected from the group consisting of Na, K, Rb, and Cs can be used.

In addition, the metal fluoride crystal according to this embodiment, which contains a high concentration of Eu and a low concentration of $Eu^{2+}$, can be produced by growing a metal fluoride crystal from melt obtained by melting a mixed raw material including an Li-source raw material containing $^6Li$, an alkaline earth metal-source raw material, a metal element-source raw material, and a Eu-source raw material in an atmosphere containing a fluorine-source gas that is broken in a growth atmosphere.

The content of the at least one kind of alkali metal element selected from the group consisting of Na, K, Rb, and Cs in this embodiment is favorably 0.001 to 10 mol % with $LiM^1M^2F_6$ as a reference. By making the content be not less than 0.001 mol %, it is possible to increase the content of $Eu^{3+}$ contained in the crystal and to reduce the content of the $Eu^{2+}$. By making the content be not less than 10 mol %, it is possible to suppress the reduction of the transmittance of the crystal due to the precipitation of excessive alkali metal elements. More favorably, the content of the alkali metal element is 0.01 to 4 mol %.

It should be noted that in the crystal, the alkali metal element is considered to exist between the mother crystal grid of $LiM^1M^2F_6$. However, the accurate existing state is not clear. Examples of the estimated existing state of the alkali metal element include a state where two alkaline earth metal elements ($M^1$ metal) are replaced with a pair of $Eu^{3+}$ and the alkali metal element. Accordingly, the inconsistency of the valence when the alkaline earth metal element is replaced with $Eu^{3+}$ is eliminated, $Eu^{3+}$ can stably exist in the crystal, and it is possible to maintain $Eu^{3+}$ to have a higher concentration than $Eu^{2+}$.

The content of Eu and alkali metal element can be adjusted by the amount of the Eu-source raw material being a Eu-source added to the raw material mixture when the crystal is produced and the alkali metal-source raw material being an alkali metal element source.

Furthermore, a method of producing a metal fluoride crystal according to an embodiment of the present invention includes melting a mixed raw material including a Li-source raw material containing $^6Li$, an alkaline earth metal-source raw material, a metal element-source raw material, and a Eu-source raw material.

From melt of the mixed raw material, a metal fluoride crystal including a crystal represented by a chemical formula $LiM^1M^2F_6$ (in the formula, Li includes $^6Li$, $M^1$ represents at least one kind of alkaline earth metal element selected from the group consisting of Mg, Ca, Sr, and Ba, and $M^2$ represents at least one kind of metal element selected from the group consisting of Al, Ga, and Sc) is grown in an atmosphere containing a fluorine-source gas broken in a growth atmosphere, the crystal containing not less than 0.02 mol % of Eu, the crystal having a concentration of Eu2+ of less than 0.01 mol %.

Typically, the atmosphere during growth is a reducing atmosphere, and a europium fluoride ($EuF_3$) is used as the Eu-source raw material. When the metal fluoride crystal is grown, the europium being a Eu-source is reduced from trivalent to divalent, and is likely to exist in the form of $EuF_2$ in the crystal. In view of the above, in this embodiment, by adjusting the crystal growth atmosphere to an atmosphere containing a fluorine-source gas broken in the atmosphere, the reduction reaction of $EuF_3$ to $EuF_2$ is suppressed, the content of $Eu^{3+}$ contained in the crystal is increased, and the content of $Eu^{2+}$ is decreased.

Examples of the fluorine-source gas broken in the growth atmosphere include gas containing a carbonyl fluoride. The carbonyl fluoride reacts with water in the atmosphere, and is broken (hydrolyzed) into a fluorine-source (hydrogen fluoride). Accordingly, it is possible to make the Eu-source raw material exist stably in the form of $EuF_3$ in the crystal. Moreover, by using a carbonyl fluoride as the fluorine-source, it is possible to produce a metal fluoride crystal containing a high concentration of $Eu^{3+}$ without mixing an alkali metal-source in a raw material.

The method of growing a metal fluoride crystal is not particularly limited. Examples of the method include the Bridgman method that solidifies melt from the lower side toward the upper side in on direction by lowering a crucible, the Czochralski method that solidifies and pulls up a crystal in one direction while maintaining the solid-liquid interface at a certain position, and a micro-pulling-down method that solidifies and pulls down a crystal in one direction while maintaining the solid-liquid interface at a certain position.

Figure 3:
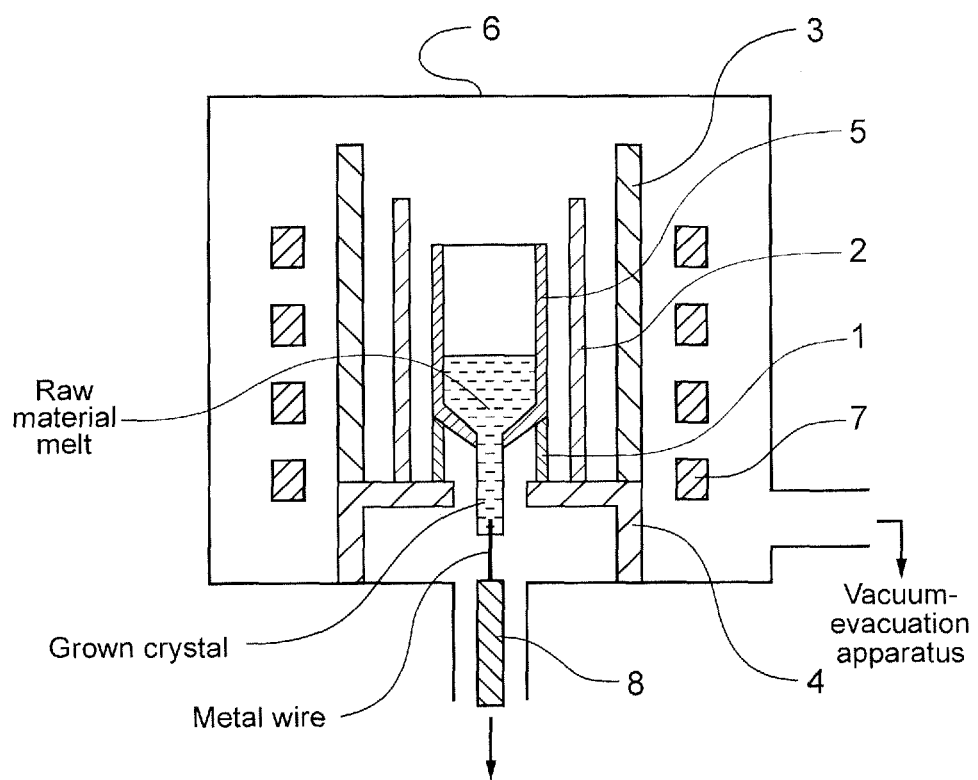
FIG. 3 A schematic diagram of crystal growth in a micro-pulling-down method.

Hereinafter, using the micro-pulling-down method as an example, the producing method will be described in detail. The micro-pulling-down method is a method in which an apparatus as shown in FIG. 3 is used to pull out a raw material melt from a hole provided at the bottom of a crucible 5 to produce a crystal.

First, a predetermined amount of raw material is filled in the crucible 5 having a hole at the bottom thereof. The shape of the hole provided at the bottom of the crucible is not particularly limited, but is favorably a cylindrical shape having the diameter of 0.5 to 4 mm and the length of 0 to 2 mm.

In this embodiment, the purity of the raw material is favorably not less than 99.99%. By using such a raw material, the purity of the crystal can be increased and the amount of light emission is expected to be increased. In relation to the raw material, a mixed raw material obtained by mixing each raw material in advance has to be filled in the crucible. Alternatively, one obtained by sintering or melt-solidifying it after the mixing may be used as the raw material.

Examples of the raw material being a Li-source include a lithium fluoride. Examples of a raw material being an alkaline earth metal element-source (hereinafter, referred to as alkaline earth metal raw material) include a magnesium fluoride, a calcium fluoride, a strontium fluoride, and a barium fluoride, and the raw material is selected depending on the crystal of a target composition.

In addition, a composite crystal such as a calcium magnesium fluoride, a calcium strontium fluoride, a calcium barium fluoride, a magnesium strontium fluoride, a magnesium barium fluoride, a strontium barium fluoride, a calcium magnesium strontium fluoride, a calcium magnesium barium fluoride, a calcium strontium barium fluoride, a calcium strontium barium fluoride, and a calcium magnesium strontium barium fluoride can be used.

Examples of a raw material being a metal element-source (hereinafter, referred to also as a metal element raw material) include an aluminum fluoride, a gallium fluoride, and a scandium fluoride, and the raw material is selected depending on the crystal of a target composition.

In addition, a composite crystal such as an aluminum gallium fluoride, an aluminum scandium fluoride, a gallium scandium fluoride, and an aluminum gallium scandium fluoride can be used.

These three kinds of raw materials are a mixed raw material having a stoichiometric composition matched with the chemical composition of the target crystal. It is possible to produce the target metal fluoride crystal by melting and growing the mixed raw material.

However, because a metal element raw material such as a lithium fluoride and an aluminum fluoride is likely to volatilize as compared with an alkaline earth metal raw material such as a calcium fluoride, the melt composition is displaced when a raw material is molten with heat, and the obtained crystal becomes cloudy in some cases. In such a case, it is advantageous to use an excess amount of a lithium fluoride and a transition metal raw material with respect to the alkaline earth metal raw material. However, in order to avoid precipitation of a different phase other than the target crystal, it is favorable to make the excess amount be not more than 10 mol % with the alkaline earth metal raw material as a reference.

As the Eu-source raw material, a europium fluoride is used. In relation to the europium fluoride to be used, the concentration of $EuF_3$ is favorably not less than 95%, more favorably, not less than 99%.

In the case where the metal fluoride crystal according to this embodiment is made to contain an alkali metal element, examples of a raw material being an alkali metal element-source (hereinafter, referred to also as alkali metal raw material) include a sodium fluoride, a potassium fluoride, a rubidium fluoride, and a cesium rubidium. These materials may be used alone or in combination.

Next, the crucible 5 in which the above-mentioned raw material is filled, an after heater 1, a heater 2, a heat insulation material 3, and a stage 4 are set as shown in FIG. 3. After a vacuum-evacuation apparatus is used to vacuum-evacuate a chamber 6 to not more than $5.0 \times 10^{-4}$ Pa, an inert gas such as high-purity argon is conducted to the chamber 6 to perform gas replacement. At this time, it is favorable to perform vacuum-evacuation to not more than $5.0 \times 10^{-5}$ Pa because the effect of adding an alkali metal element cannot be obtained if a small amount of oxygen or water remains.

The pressure in the chamber after the gas replacement is generally, but not particularly limited to, atmospheric pressure. With the gas replacement operation, water attached to the raw material or chamber can be removed, and the degradation of the crystal derived from such water can be suppressed. In order to avoid the effect of water that cannot be removed by the gas replacement operation, it is favorable to use a solid scavenger such as a zinc fluoride or a gas scavenger such as a carbonyl fluoride and a carbon tetrafluoride.

The pressure in the chamber after the gas replacement is generally, but not particularly limited to, atmospheric pressure. With the gas replacement operation, water attached to the raw material or chamber can be removed, and the degradation of the crystal derived from such water can be suppressed. In order to avoid the effect of water that cannot be removed by the gas replacement operation, it is favorable to use a solid scavenger such as a zinc fluoride or a gas scavenger such as a carbonyl fluoride and a carbon tetrafluoride. Among these, by using the carbonyl fluoride as a scavenger, it is possible to remove water that cannot be removed by the gas replacement operation, to obtain the maximum effect of adding an alkali metal, and to increase the effect to reduce the concentration of $Eu^{2+}$ in the crystal. By using the carbonyl fluoride, it is possible to shorten the time period of vacuum-evacuation and to improve the productivity. Moreover, in the case where an alkali metal element is added to $LiM^1M^2F_6$, there is the risk that any one of M1 and M2 is replaced with an alkali metal element, and a fluorine element that constitutes the mother crystal is insufficient. However, by using the carbonyl fluoride as a scavenger, it is possible to supplement the fluorine element that constitutes the mother crystal, to obtain the maximum effect of adding an alkali metal, and to increase the effect to reduce the concentration of $Eu^{2+}$ in the crystal.

The amount of carbonyl fluoride to be used is favorably 0.01 to 20 v/v with respect to the entire gas in the chamber. By making the content be not less than 0.01 v/v, it is possible to obtain the maximum effect of adding an alkali metal, and to increase the effect to reduce the concentration of $Eu^{2+}$ in the crystal. By making the content be not more than 20 v/v, it is possible to reduce damage on the furnace and components due to the excess amount of carbonyl fluoride, and to use the furnace and components for a long period of time. More favorably, the amount of carbonyl fluoride to be used is 1 to 10 v/v.

After the gas replacement operation is performed, a raw material is molten with heat by a high radio-frequency coil 7, the molten raw material melt is pulled out from the hole provided at the bottom of the crucible, and the growth of the crystal is started.

In the case where the metal fluoride crystal is produced by a micro-pulling-down method, the wettability of the raw material melt to the crucible is low and the melt is unlikely to exudate from the hole provided at the bottom of the crucible in some cases. In such a case, by providing a metal wire to the tip of a pulling-down rod, inserting the metal wire in the crucible from the hole provided at the bottom of the crucible, and attaching the raw material melt to the metal wire before the raw material melt is pulled down together with the metal wire, it is possible to grow the crystal. For example, the output of high radio-frequency is adjusted, the metal wire is inserted in the hole provided at the bottom of the crucible while gradually increasing the temperature of the raw material from the melting point of the metal fluoride, and the pulling-out is performed. The operation is repeated until the raw material melt is pulled out together with the metal wire, and the growth of the crystal is started. Any material can be used as the metal wire without any restriction as long as it does not react with the raw material melt substantially, and a material having an excellent corrosion resistance to a high temperature such as a W—Re alloy is favorable.

After the pulling-out of the raw material melt is performed with the metal wire, it is possible to obtain a crystal by performing continuous pull-down at a constant pull-down speed. The pull-down speed is favorably, but not particularly limited to, in the range of 0.5 to 10 mm/hr.

In the production of the metal fluoride crystal in this embodiment, an annealing operation may be performed after the production of the crystal to remove a crystal defect of the crystal due to thermal strain.

The obtained metal fluoride crystal has favorable processability and can be processed in a desired shape and used. In the processing, a wall-known cutting machine such as a blade saw and a wire saw, a grinding machine, or a lap can be used without any restriction.

The metal fluoride crystal may be processed in a desired shape and used as various light emitting elements, and can be favorably used for a photolithography technique, cleaning a substrate of a semiconductor or liquid crystal, sterilization, a next-generation high-capacity optical disc, medical use (ophthalmic treatment and DNA breakage), or a neutron scintillator.

In the case where it is used for a neutron scintillator, the shape thereof may be an arbitrary one, and can be a plate shape, a block shape, or an array shape obtained by arranging a plurality of eutectic crystals having a quadrangular prism shape. The neutron scintillator can be combined with a light detector such as a photomultiplier to form a neutron detector. Specifically, by converting the scintillation light emitted from the neutron scintillator by the irradiation of a neutron into an electric signal with the photomultiplier, it is possible to capture the presence/absence and intensity of a neutron as an electric signal. The scintillation light emitted from the crystal in the present invention is light having a wavelength of 350 to 400 nm, and a photomultiplier that can detect light in the area can be used particularly favorably. Specific examples of such a photomultiplier include R7600U and H7416 produced by Hamamatsu Photonics K.K. It should be noted that the structure of the neutron detector or method of producing the neutron detector is not particularly limited, and a well-known structure and method can be employed.

Specific examples include a method of attaching the neutron scintillator according to this embodiment to a photoelectric surface of a photomultiplier with optical grease or the like, applying high voltage to the photomultiplier, and measuring an electric signal output from the photomultiplier. In order to use the electric signal output from the photomultiplier to analyze the intensity of a neutron ray, an amplifier, a multi-channel pulse-height analyzer, or the like may be provided to the subsequent stage of the photomultiplier.

The neutron scintillator including a eutectic crystal according to this embodiment can be combined with a position sensitive light detector to form a neutron imaging apparatus. A position sensitive photomultiplier can be favorably used for such a position sensitive light detector, and specific examples of such a position sensitive light detector include XP85012 produced by PHOTONIS.

EXAMPLE

Hereinafter, examples of the present invention will be described specifically. However, the present invention is not particularly limited by the examples. Moreover, the combination of the features described in the examples is not necessarily essential to means for solving the problems of the present invention.

Example 1

[Metal Fluoride Crystal]
The crystal production apparatus shown in FIG. 3 was used to produce a crystal of a lithium calcium aluminum fluoride containing Eu and Na. As a raw material, a lithium fluoride having a purity of 99.99% (ratio of $^6$Li isotope being 95%), a calcium fluoride, an aluminum fluoride, a europium fluoride (ratio of $EuF_3$ being 99%), and a sodium fluoride were used. The after heater 1, the heater 2, the heat insulation material 3, the stage 4, and the crucible 5, which were made of highpurity carbon, were used, and the shape of the hole provided at the bottom of the crucible is a cylindrical shape having the diameter of 2.0 mm and the length of 0.5 mm.

First, 0.54 g of lithium fluoride, 1.69 g of calcium fluoride, 1.82 g of aluminum fluoride, 90 mg of europium fluoride, and 18 mg of sodium fluoride were weighed, and mixed well before they were filled in the crucible 5. The crucible 5 in which the raw material was filled was set on the upper portion of the after heater 1, and the heater 2 and the heat insulation material 3 were successively set around it. Next, a vacuumevacuation apparatus including an oil rotation pump and an oil diffusion pump was used to vacuum-evacuate the chamber 6 to $5.0 \times 10^{-5}$ Pa. At the same time, the high radio-frequency coil 7 is used to perform heating so that the temperature inside of the crucible is 570 K during the vacuum-evacuation.

The mixed gas of argon 95 vol. %-carbonyl fluoride 5 vol. % was introduced to the chamber 6, and the high radiofrequency coil 7 was used to adjust the output of the high radio-frequency heating coil so that the heating temperature was 790 K while measuring the temperature at the bottom of the crucible. The pressure in the chamber 6 after the mixed gas replacement was atmospheric pressure, and the heating was continued for 30 minutes in the state.

Next, vacuum-evacuation was performed while continuing the heating with the high radio-frequency heating coil, and the mixed gas of argon 95 vol. %-carbon tetrafluoride 5 vol. % was introduced in the chamber 6 to perform gas replacement. The pressure in the chamber 6 after the mixed gas of argon 95 vol. %-carbon tetrafluoride 5 vol. % replacement was atmospheric pressure. The same operation was performed two times. The atmosphere of the mixed gas of argon 95 vol. %-carbon tetrafluoride 5 vol. % was an atmosphere during the crystal growth.

The high-frequency heating coil 7 was used to melt the raw material by heating it to the melting point of a lithium calcium aluminum fluoride. Next, by repeating the operation of inserting the metal wire including a W—Re alloy provided at the tip of a pulling-down rod 8 in the hole provided at the bottom of the crucible 5 and pulling down it while gradually increasing the temperature of the raw material melt by adjusting the high radio-frequency output, the raw material melt was pulled out from the hole. The high radio-frequency output was fixed so that the temperature at that time was maintained, the melt of the raw material was pulled down and the growth of the crystal was started. The pull-down was continued for 14 hours at the speed of 3 mm/hr, and a lithium calcium aluminum fluoride crystal, which had the diameter of 2.1 mm and the length of 40 mm and contained Eu and Na, was finally obtained.

The content of Eu or the like was measured by the measurement of transmission spectrum. As a result, the content of Eu in the crystal was 0.083 mol %, the content of $Eu^{3+}$ was 0.083 mol %, the content of $Eu^{2+}$ was less than 0.001 mol %, and the content of Na measured by ICP-MS was 0.90 mol %. It should be noted that the content of Eu or the like calculated by the measurement of transmission spectrum was measured by using a calibration curve defined by ICP-MS (inductively coupled plasma mass spectrometry) measurement.

(Evaluation for Ultraviolet Visible Light Transparent Characteristics)

The obtained metal fluoride crystal according to the present invention was cut to the length of about 15 mm with a blade saw having a diamond cutting grindstone, and the side surface thereof was processed by grinding in the shape having the length of 15 mm, the width of 2 mm, and the thickness of 1 mm before optic polishing was performed on two ultraviolet visible light output surfaces being surfaces having the length of 15 mm and the width of 2 mm, to obtain measurement sample. The ultraviolet visible light transparent characteristics of the measurement sample were measured by the following way. It should be noted that the measurement was performed with the inside of the apparatus being replaced with nitrogen.

Figure 4:
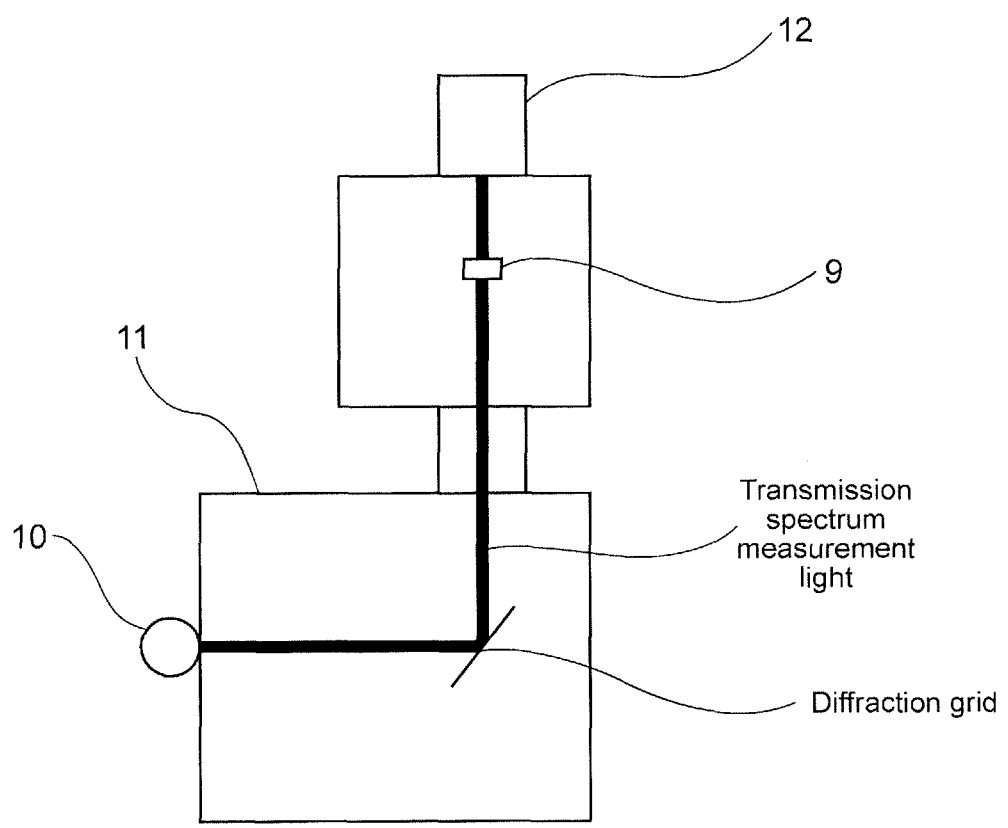
FIG. 4 A schematic diagram of an ultraviolet-visible transmitted light measuring apparatus.
Figure 5:
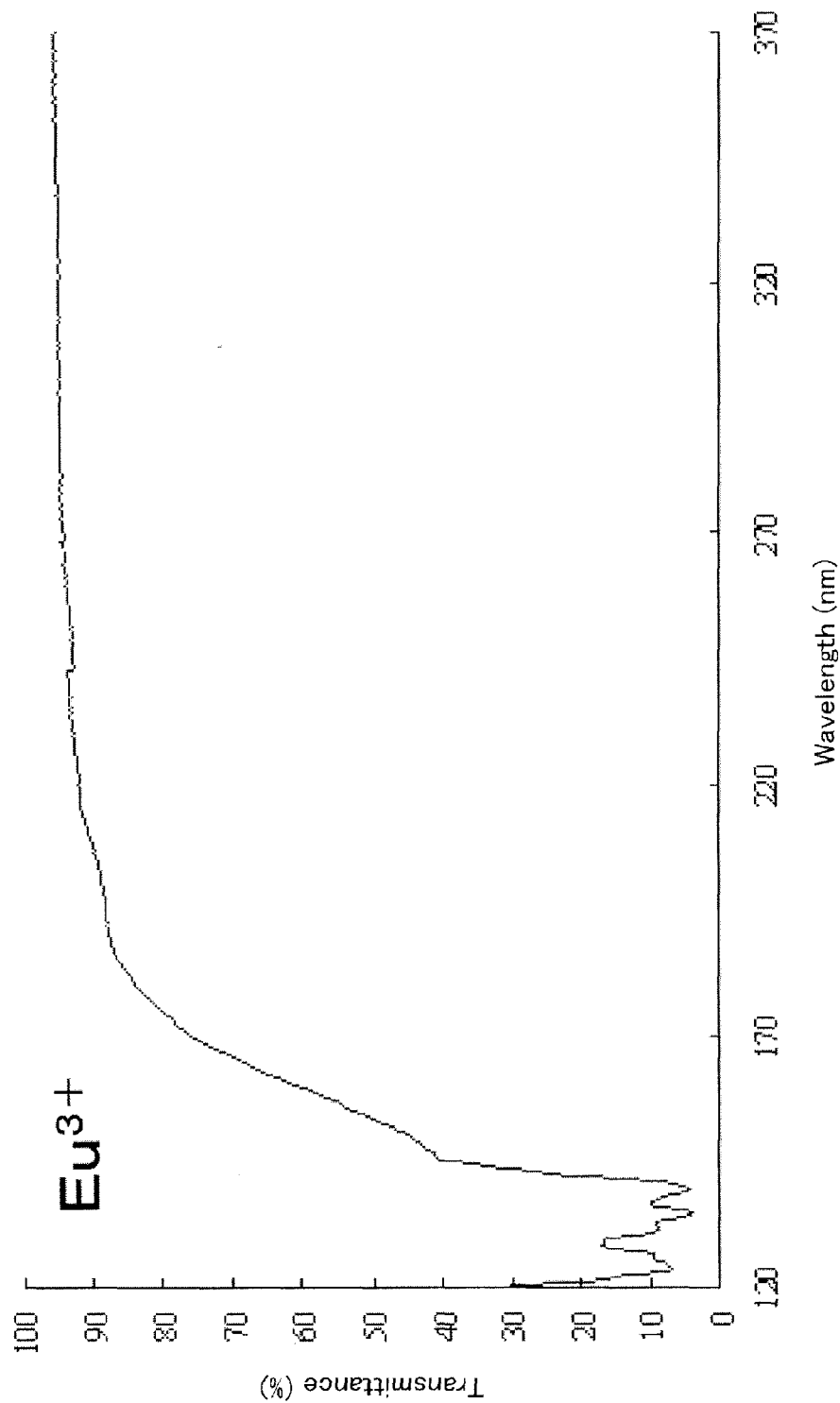
FIG. 5 Measurement results of transmission spectrum of a Na- and Eu-doped LiCAF in an example 1.

Ultraviolet rays generated from a deuterium lamp 10 were monochromated by a spectrometer (KV201 extreme ultraviolet spectrometer produced by Bunkoukeiki Co., Ltd.) placed in a chamber 11, and ultraviolet visible light having a wavelength of 120 nm to 370 nm was obtained. The ultraviolet visible light was applied to the ultraviolet visible light output surface of a measurement sample 9. By detecting the ultraviolet visible light passing through the measurement sample 9 with a photomultiplier 12, the transmission spectrum of the measurement sample was obtained (FIG. 4 and FIG. 5).

Example 2

[Crystal Growth in Ar Atmosphere]
The crystal growth was performed in the same way as the example 1 except that as a raw material, 0.54 g of a lithium fluoride, 1.69 g of calcium fluoride, 1.82 g of aluminum fluoride, 90 mg of europium fluoride, and 18 mg of sodium fluoride were weighed and the atmosphere during the crystal growth was argon, and a lithium calcium aluminum fluoride crystal that had the diameter of 2.1 mm and the length of 40 mm and contained Eu was finally obtained.

The content of various ions in the crystal was checked by the analysis with ICP and measurement of transmission spectrum. As a result, the content of Eu in the crystal was 0.082 mol %, the content of $Eu^{3+}$ was 0.082 mol %, the content of $Eu^{2+}$ was less than 0.001 mol %, and the content of Na was 0.88 mol %.

Figure 6:
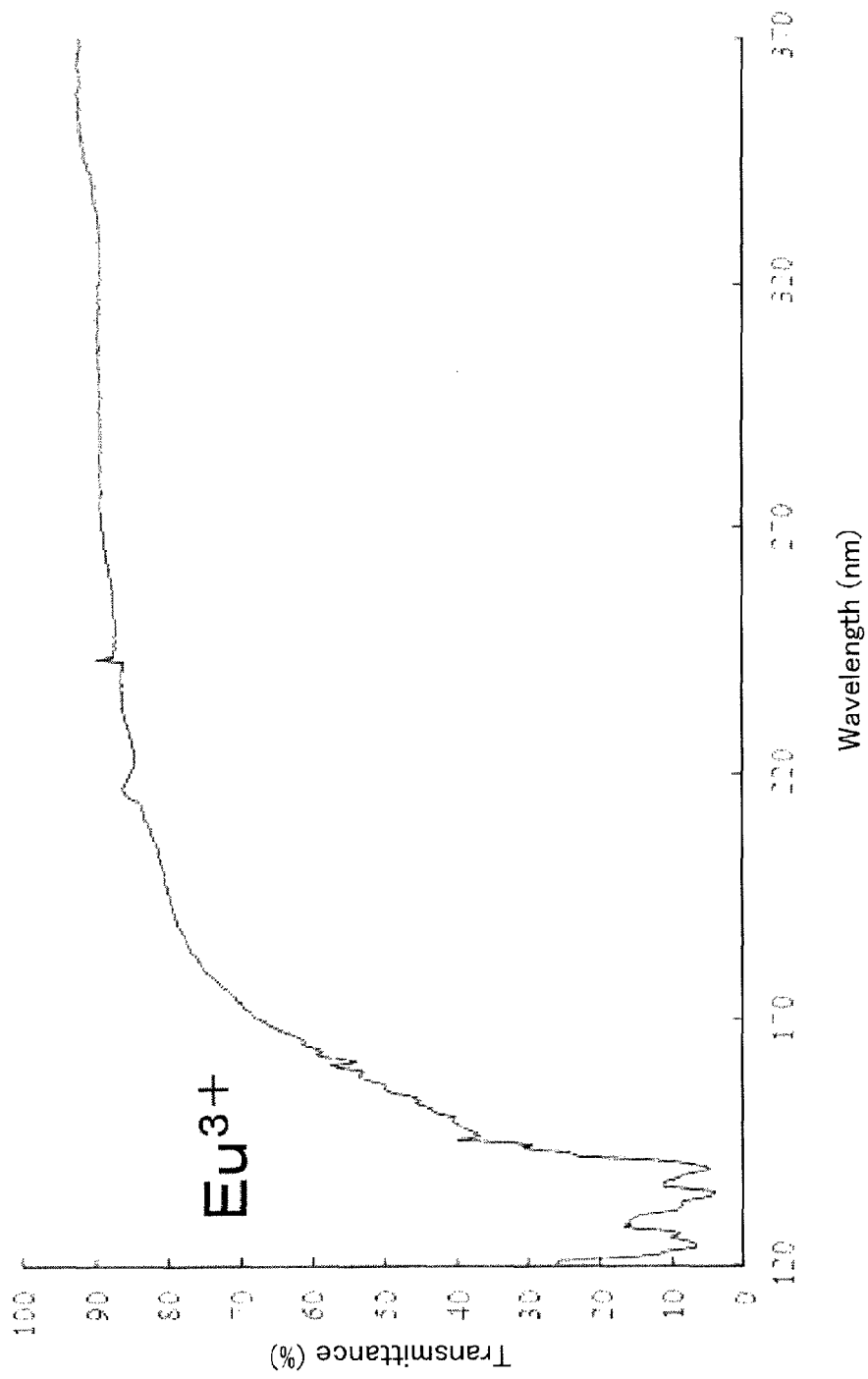
FIG. 6 Measurement results of transmission spectrum of a Na- and Eu-doped LiCAF in an example 2.

The obtained crystal was processed as a sample for measurement of ultraviolet visible light characteristics, and the transmission spectrum thereof was measured (FIG. 6).

Example 3

[Crystal Growth when Na Concentration is Changed]
As a raw material, 0.54 g of lithium fluoride, 1.69 g of calcium fluoride, 1.82 g of aluminum fluoride, 90 mg of europium fluoride, and 9 mg of sodium fluoride were weighed, the crystal growth was performed in the same way as the example 1, and a lithium calcium aluminum fluoride crystal that had the diameter of 2.1 mm and the length of 40 mm and contained Eu was finally obtained.

The content of various ions in the crystal was checked by the analysis with ICP and measurement of transmission spectrum. As a result, the content of Eu in the crystal was 0.087 mol %, the content of $Eu^{3+}$ was 0.087 mol %, the content of $Eu^{2+}$ was less than 0.001 mol %, and the content of Na was 0.44 mol %.

Figure 7:
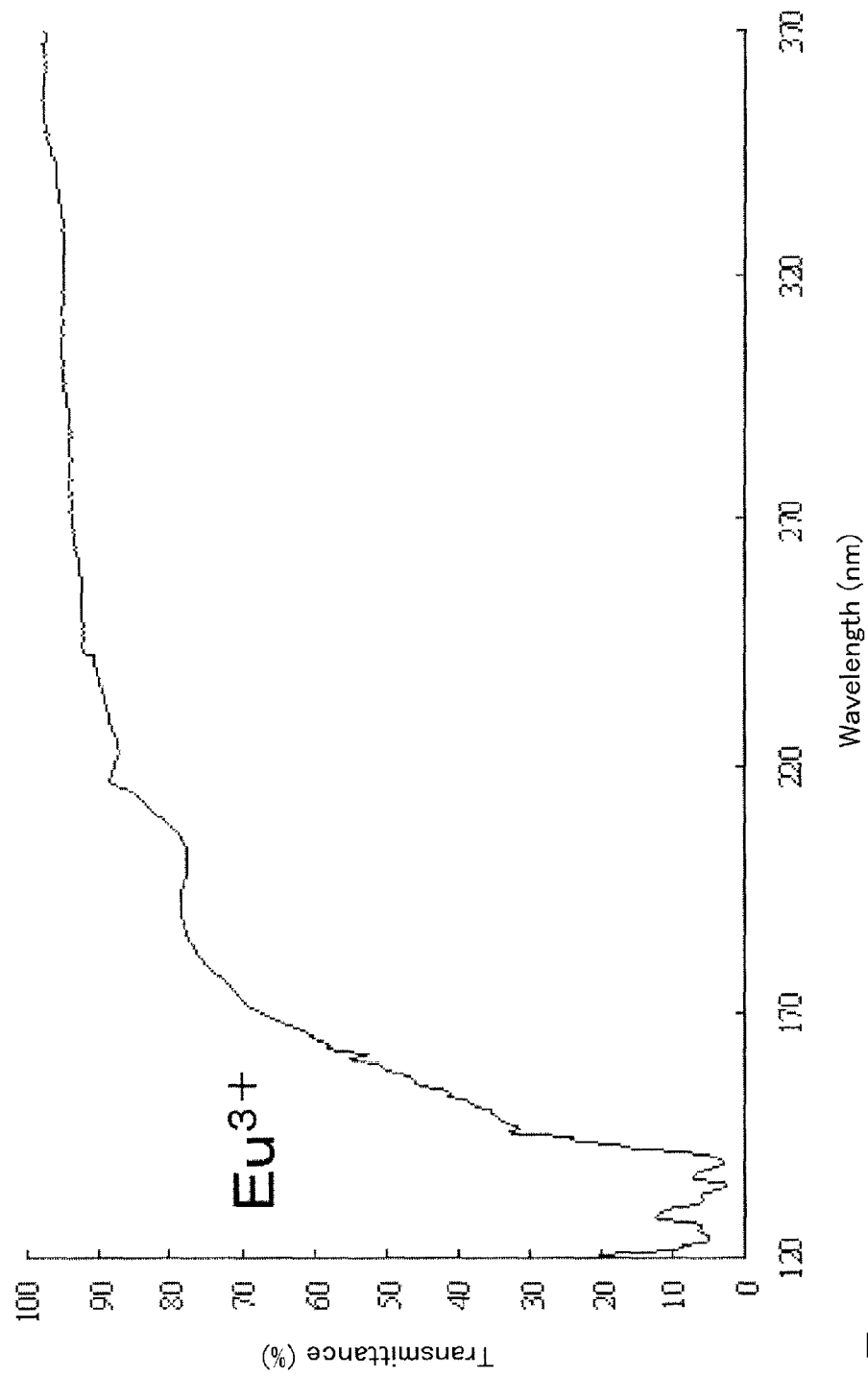
FIG. 7 Measurement results of transmission spectrum of a Na- and Eu-doped LiCAF in an example 3.

The obtained crystal was processed as a sample for measurement of ultraviolet visible light characteristics, and the transmission spectrum thereof was measured (FIG. 7).

Example 4

[Crystal Growth when Na Concentration is Changed]
As a raw material, 1.09 g of lithium fluoride, 3.39 g of calcium fluoride, 3.65 g of aluminum fluoride, 182 mg of europium fluoride, and 1.8 mg of sodium fluoride were weighed, the crystal growth was performed in the same way as the example 1, and a lithium calcium aluminum fluoride crystal that had the diameter of 2.1 mm and the length of 40 mm and contained Eu was finally obtained.

The content of various ions in the crystal was checked by the analysis with ICP and measurement of transmission spectrum. As a result, the content of Eu in the crystal was 0.090 mol %, the content of $Eu^{3+}$ was 0.090 mol %, the content of $Eu^{2+}$ was less than 0.001 mol %, and the content of Na was 0.04 mol %.

Figure 8:
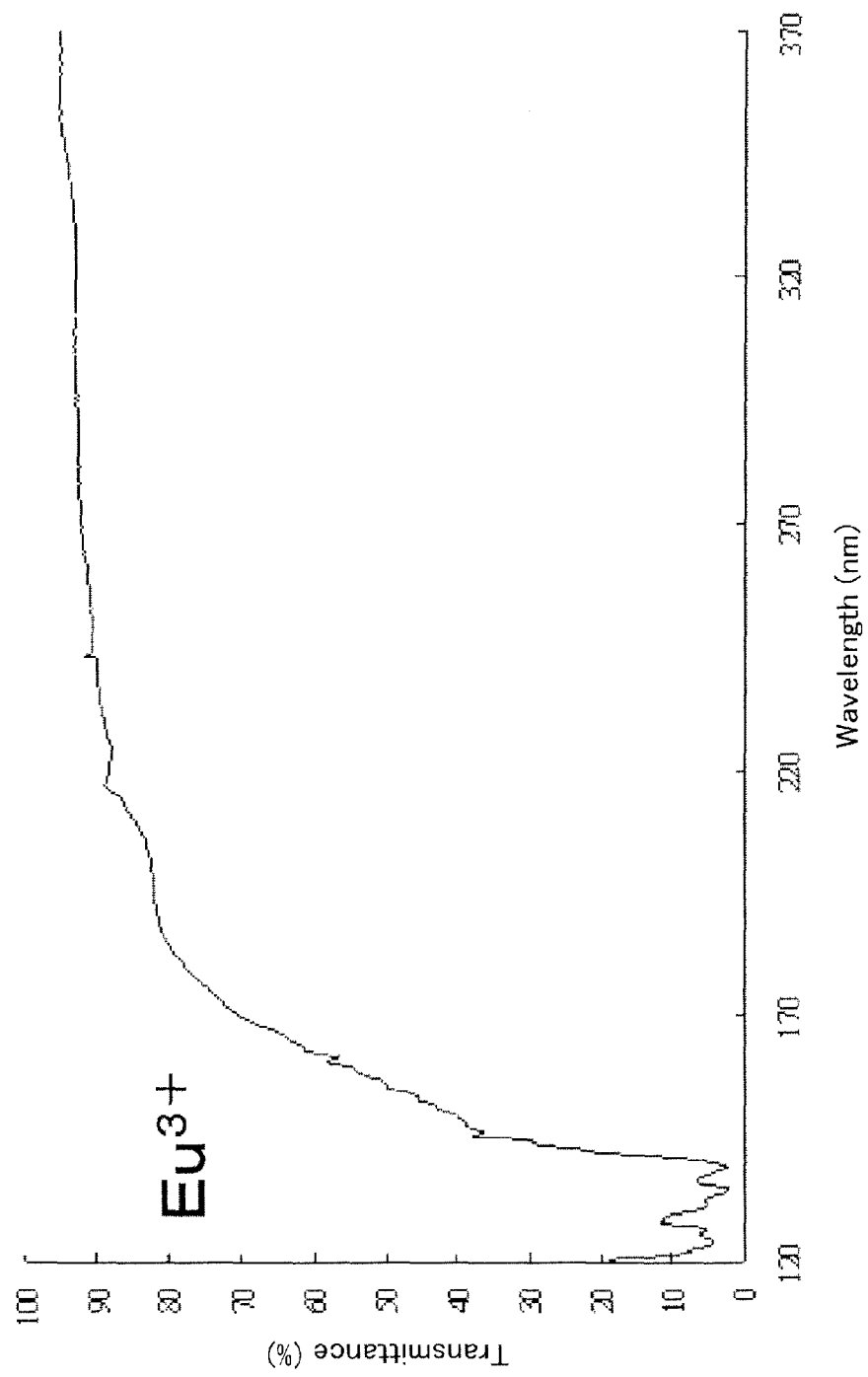
FIG. 8 Measurement results of transmission spectrum of a Na- and Eu-doped LiCAF in an example 4.

The obtained crystal was processed as a sample for measurement of ultraviolet visible light characteristics, and the transmission spectrum thereof was measured (FIG. 8).

Example 5

[Crystal Growth in Atmosphere of Carbonyl Fluoride Containing No Alkali Metal]
As a raw material, 0.54 g of lithium fluoride, 1.69 g of calcium fluoride, 1.82 g of aluminum fluoride, and 90 mg of europium fluoride were weighed, the crystal growth was performed in the same way as the example 1 except that the atmosphere during the crystal growth was the mixed gas of argon 95 vol. %-carbonyl fluoride 5 vol. %, and a lithium calcium aluminum fluoride crystal that had the diameter of 2.1 mm and the length of 40 mm and contained Eu was finally obtained.

The content of various ions in the crystal was checked by the analysis with ICP and measurement of transmission spectrum. As a result, the content of Eu in the crystal was 0.084 mol %, the content of $Eu^{3+}$ was 0.084 mol %, the content of $Eu^{2+}$ was less than 0.001 mol %, and the content of Na was less than 0.001 mol %.

Figure 9:
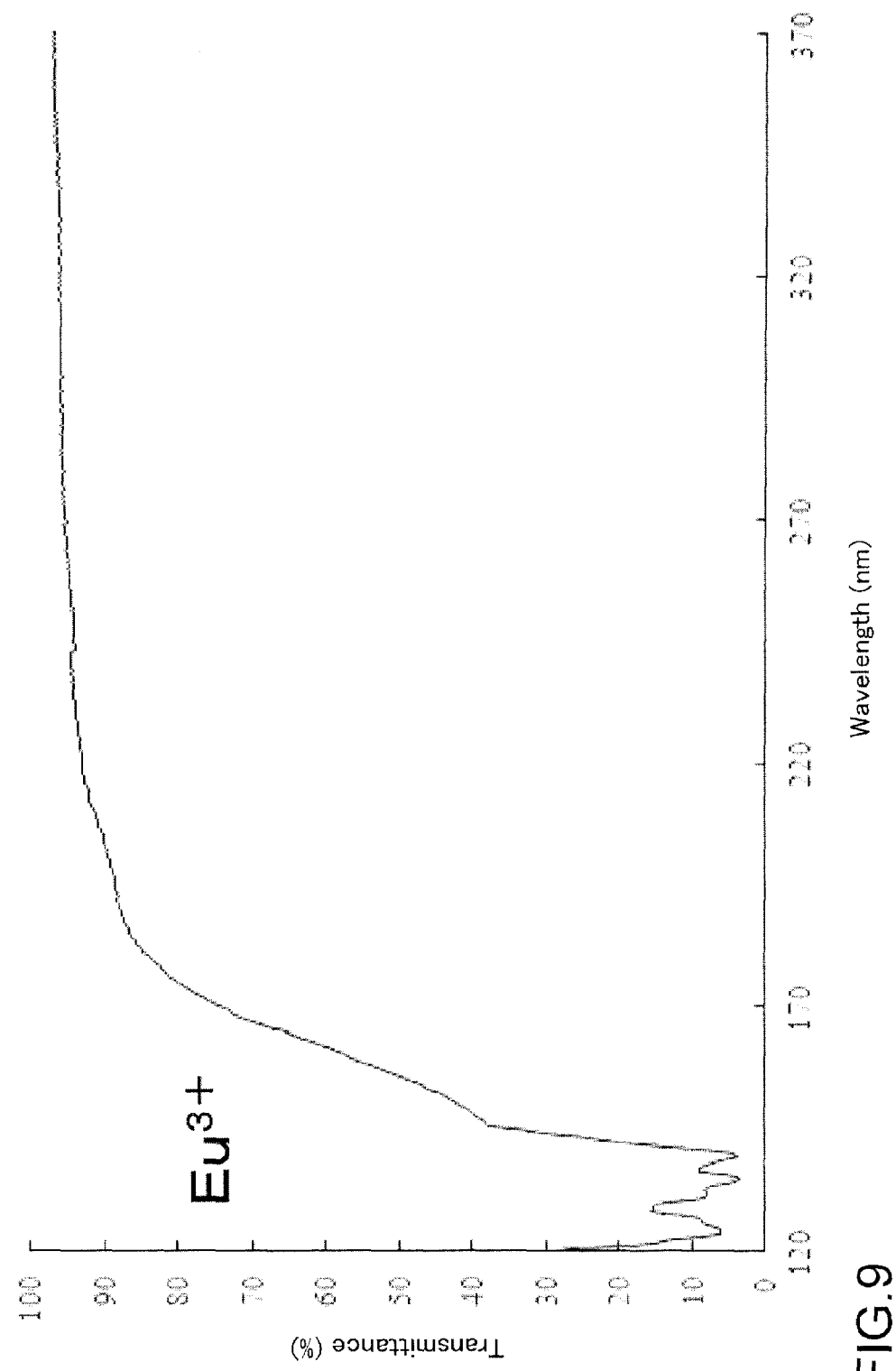
FIG. 9 Measurement results of transmission spectrum of a Eu-doped LiCAF in an example 5.

The obtained crystal was processed as a sample for measurement of ultraviolet visible light characteristics, and the transmission spectrum thereof was measured (FIG. 9).

Example 6

[Crystal Growth in Atmosphere of Carbonyl Fluoride Containing Alkali Metal]
As a raw material, 0.55 g of lithium fluoride, 1.64 g of calcium fluoride, 1.85 g of aluminum fluoride, 88 mg of europium fluoride, and 18 mg of a sodium fluoride were weighed, the crystal growth was performed in the same way as the example 1 except that the atmosphere during the crystal growth was the mixed gas of argon 95 vol. %-carbonyl fluoride 5 vol. %, and a lithium calcium aluminum fluoride crystal that had the diameter of 2.1 mm and the length of 40 mm and contained Eu was finally obtained.

The content of various ions in the crystal was checked by the analysis with ICP and measurement of transmission spectrum. As a result, the content of Eu in the crystal was 0.088 mol %, the content of $Eu^{3+}$ was 0.088 mol %, the content of $Eu^{2+}$ was less than 0.001 mol %, and the content of Na was less than 0.87 mol %.

Figure 10:
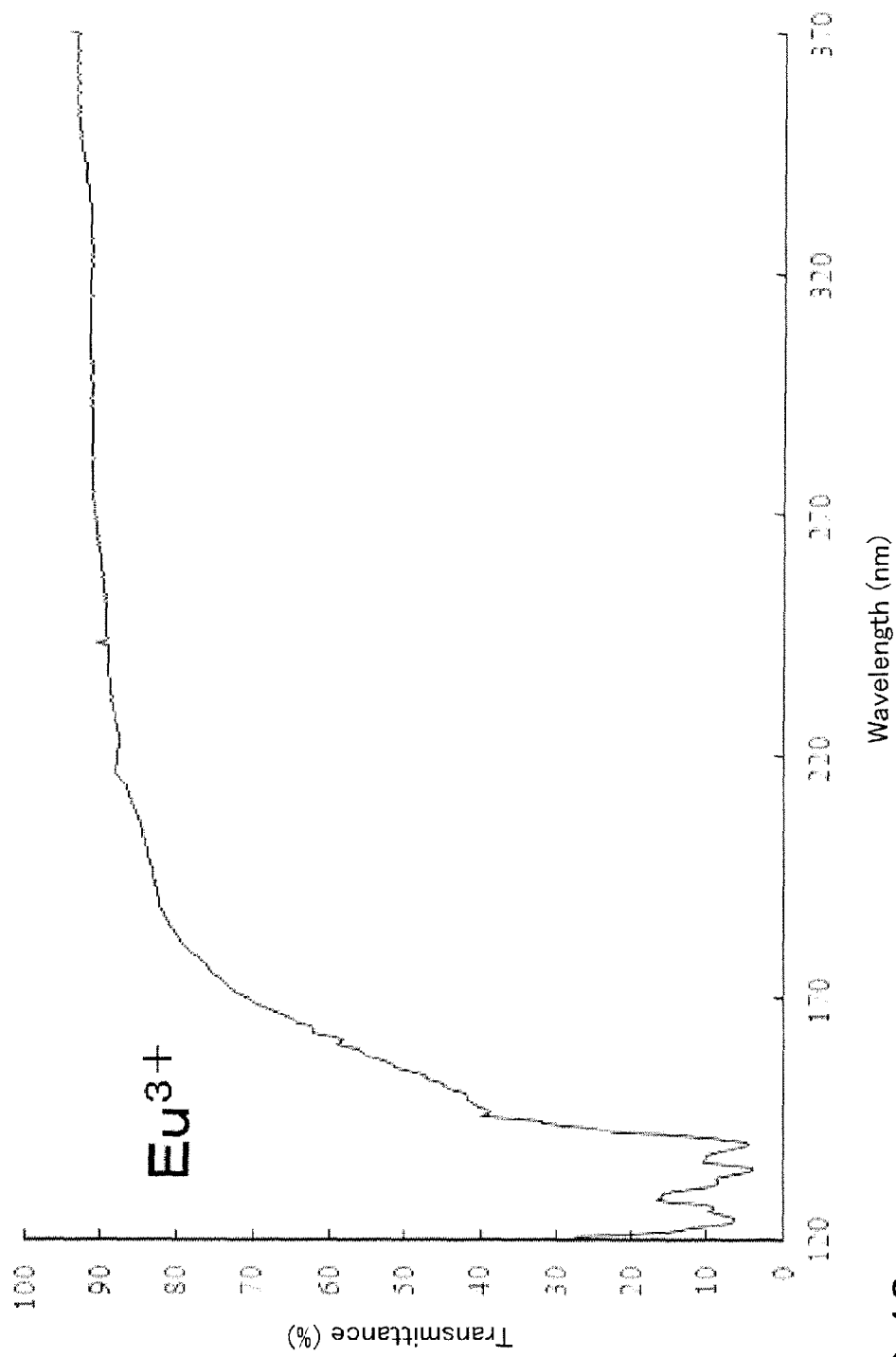
FIG. 10 Measurement results of transmission spectrum of a Na- and Eu-doped lithium strontium aluminum fluoride crystal in an example 6.

The obtained crystal was processed as a sample for measurement of ultraviolet visible light characteristics, and the transmission spectrum thereof was measured (FIG. 10).

Example 7

[Lithium Strontium Aluminum Fluoride Crystal]
The crystal growth was performed in the same way as the example 1 except that as a raw material, 0.43 g of lithium fluoride, 2.05 g of strontium fluoride, 1.44 g of aluminum fluoride, 68 mg of europium fluoride, and 14 mg of a sodium fluoride were weighed and the raw material was well mixed and used, and a lithium strontium aluminum fluoride crystal that had the diameter of 2.1 mm and the length of 40 mm and contained Eu was finally obtained.

The content of various ions in the crystal was checked by the analysis with ICP and measurement of transmission spectrum. As a result, the content of Eu in the crystal was 0.085 mol %, the content of $Eu^{3+}$ was 0.085 mol %, the content of $Eu^{2+}$ was less than 0.001 mol %, and the content of Na was less than 0.91 mol %.

Figure 11:
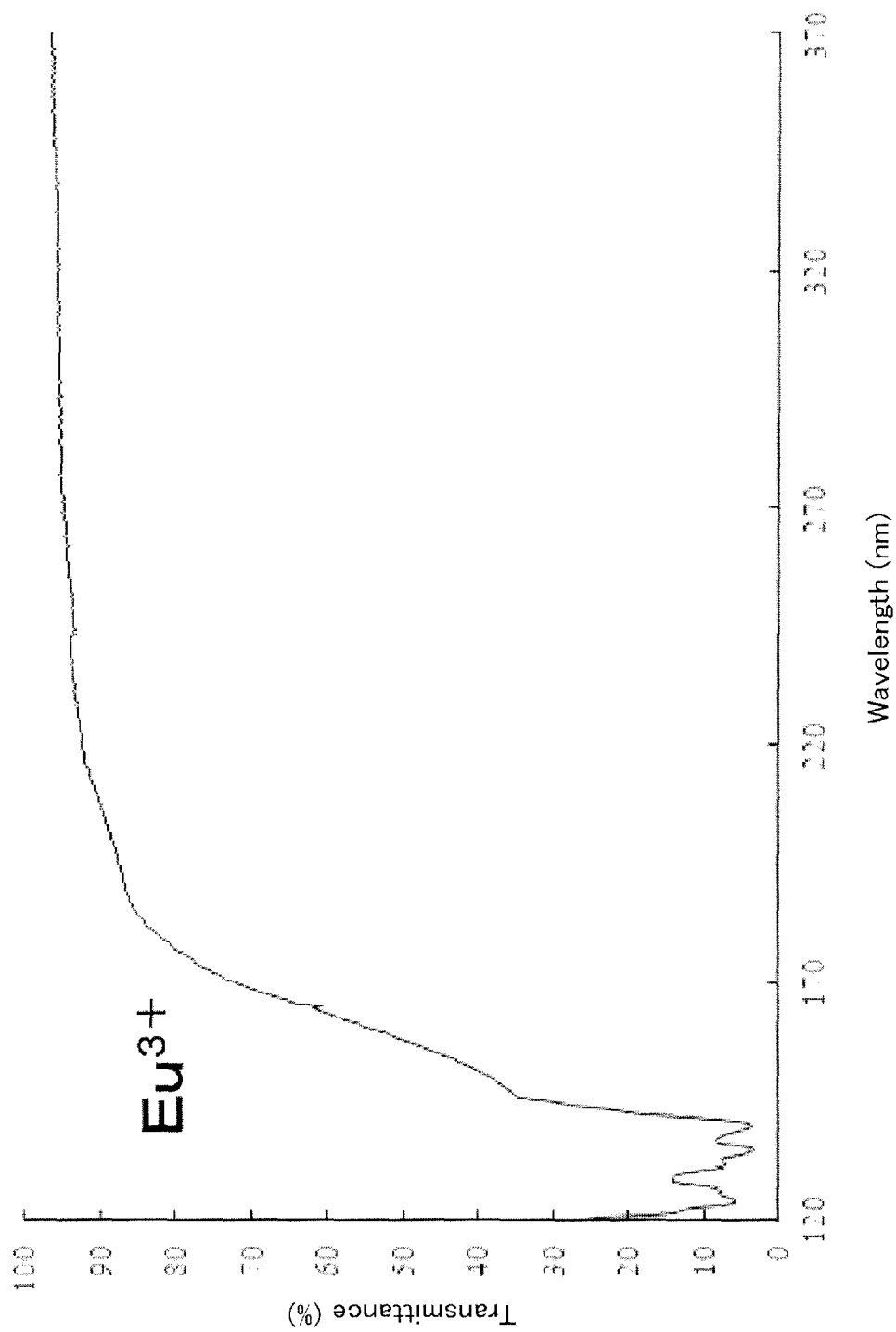
FIG. 11 Measurement results of transmission spectrum of a Na- and Eu-doped LiCAF in an example 7.

The obtained crystal was processed as a sample for measurement of ultraviolet visible light characteristics, and the transmission spectrum thereof was measured (FIG. 11).

Comparative Example 1

[Metal Fluoride Crystal Containing No Alkali Metal]
The crystal growth was performed in the same way as the example 1 except that as a raw material, 0.54 g of lithium fluoride, 1.70 g of calcium fluoride, 1.83 g of aluminum fluoride, and 91 mg of europium fluoride were weighed, and a lithium calcium aluminum fluoride crystal that had the diameter of 2.1 mm and the length of 40 mm and contained Eu was finally obtained.

The content of various ions in the crystal was checked by the analysis with ICP-MS and measurement of transmission spectrum. As a result, the content of Eu in the crystal was 0.069 mol %, the content of $Eu^{3+}$ was 0.045 mol %, and the content of $Eu^{2+}$ was 0.024 mol %.

Figure 12:
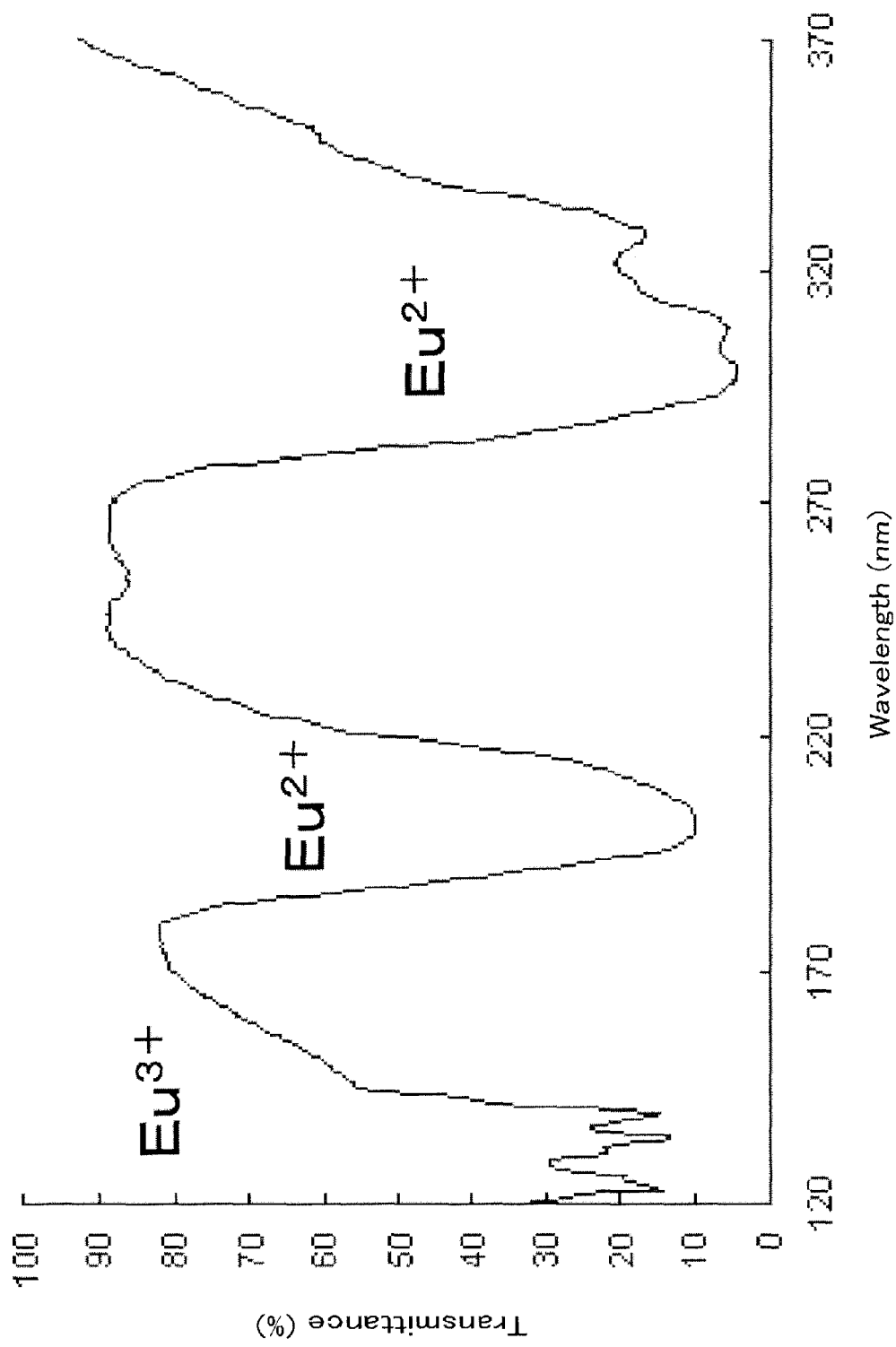
FIG. 12 Measurement results of transmission spectrum of a Eu-doped LiCAF in a comparative example 1.

The obtained crystal was processed as a sample for measurement of ultraviolet visible light characteristics, and the transmission spectrum thereof was measured (FIG. 12).

As compared with the transmission spectrum of the lithium calcium aluminum fluoride crystal having the content of $Eu^{2+}$ is less than 0.02% (FIGS. 5 to 11) in the examples, it can be seen that the absorption of $Eu^{2+}$ is observed in FIG. 12 and $Eu^{2+}$ is contained while the absorption of $Eu^{2+}$ is not observed in FIGS. 5 to 11. These results show that the lithium calcium aluminum fluoride crystal having the content of $Eu^{2+}$ is less than 0.02% produced in each example has a high permeability for light of wavelength from 350 nm to 400 nm being a wavelength of scintillation light due to $Eu^{2+}$.

Moreover, the metal fluoride crystal according to the comparative example 1 is different from the example 1 in that the raw material includes no alkali metal, and is different from the example 5 in that the crystal growth atmosphere is not a carbonyl fluoride atmosphere. Accordingly, it is estimated that the metal fluoride crystal according to the comparative example 1 cannot suppress the concentration of $Eu^{2+}$ to less than 0.01 mol %. In other words, the concentration of $Eu^{2+}$ can be suppressed to less than 0.01 mol % only by making the raw material contain an alkali metal or the atmosphere during crystal growth be a carbonyl fluoride atmosphere. Accordingly, it can be seen that the producing method according to the present invention is effective.

Comparative Example 2

[Metal Fluoride Crystal Containing No Alkali Metal]
The crystal growth was performed in the same way as the example 2 except that as a raw material, 0.54 g of lithium fluoride, 1.70 g of calcium fluoride, 1.83 g of aluminum fluoride, and 91 mg of europium fluoride were weighed, and a lithium calcium aluminum fluoride crystal that had the diameter of 2.1 mm and the length of 40 mm and contained Eu was finally obtained.

The content of various ions in the crystal was checked by the analysis with ICP-MS and measurement of transmission spectrum. As a result, the content of Eu in the crystal was 0.070 mol %, the content of $Eu^{3+}$ was 0.045 mol %, and the content of $Eu^{2+}$ was 0.025 mol %.

Figure 13:
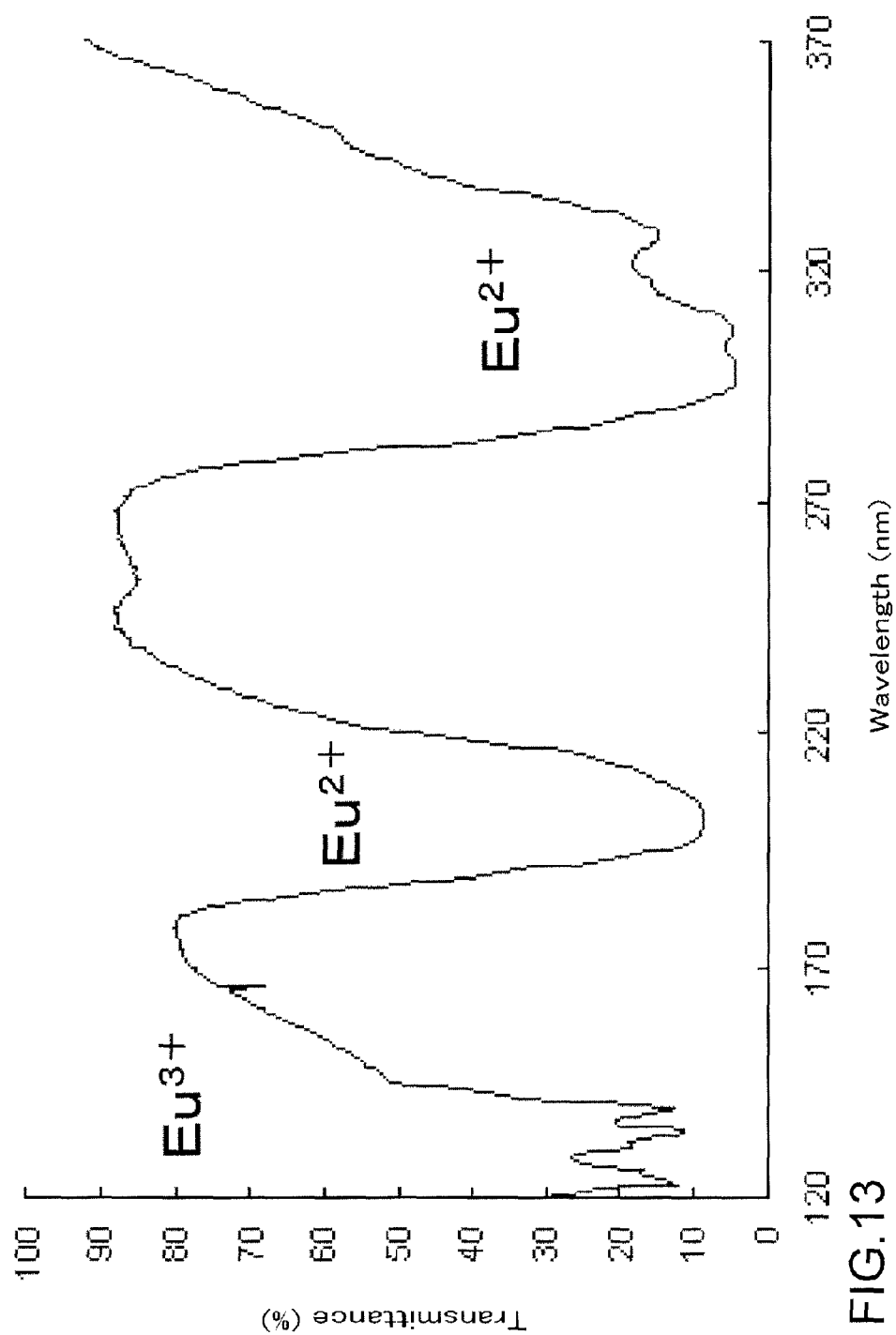
FIG. 13 Measurement results of transmission spectrum of a Eu-doped LiCAF in a comparative example 2.

The obtained crystal was processed as a sample for measurement of ultraviolet visible light characteristics, and the transmission spectrum thereof was measured (FIG. 13).

Comparative Example 3

[Metal Fluoride Crystal Containing No Alkali Metal]
The crystal growth was performed in the same way as the example 1 except that as a raw material, 0.45 g of lithium fluoride, 2.15 g of calcium fluoride, 1.51 g of aluminum fluoride, and 72 mg of europium fluoride were weighed, and a lithium calcium aluminum fluoride crystal that had the diameter of 2.1 mm and the length of 40 mm and contained Eu was finally obtained.

The content of various ions in the crystal was checked by the analysis with ICP-MS and measurement of transmission spectrum. As a result, the content of Eu in the crystal was 0.141 mol %, the content of $Eu^{3+}$ was 0.092 mol %, and the content of $Eu^{2+}$ was 0.049 mol %.

Figure 14:
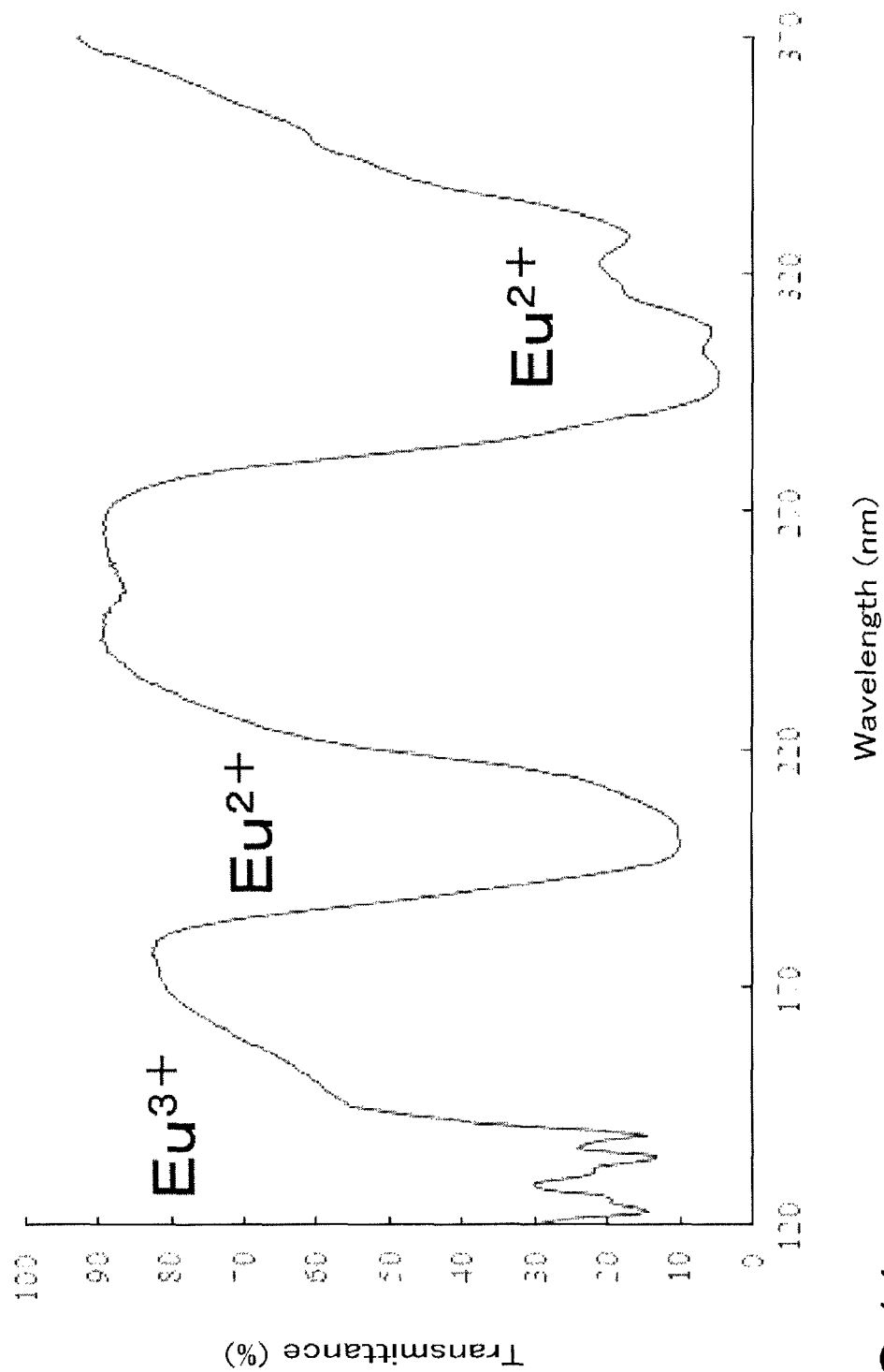
FIG. 14 Measurement results of transmission spectrum of a Eu-doped lithium strontium aluminum fluoride crystal in a comparative example 3.

The obtained crystal was processed as a sample for measurement of ultraviolet visible light characteristics, and the transmission spectrum thereof was measured (FIG. 14).

As compared with the transmission spectrum of the lithium strontium aluminum fluoride crystal having the content of $Eu^{2+}$ is less than 0.02% (FIG. 11) in the example, it can be seen that the absorption of $Eu^{2+}$ is observed in FIG. 14 and $Eu^{2+}$ is contained while the absorption of $Eu^{2+}$ is not observed in FIG. 11. These results show that the lithium calcium aluminum fluoride crystal having the content of $Eu^{2+}$ is less than 0.02% produced in each example has a high permeability for light of wavelength from 350 nm to 400 nm being a wavelength of scintillation light due to $Eu^{2+}$.

[Neutron Scintillator]

Figure 18:
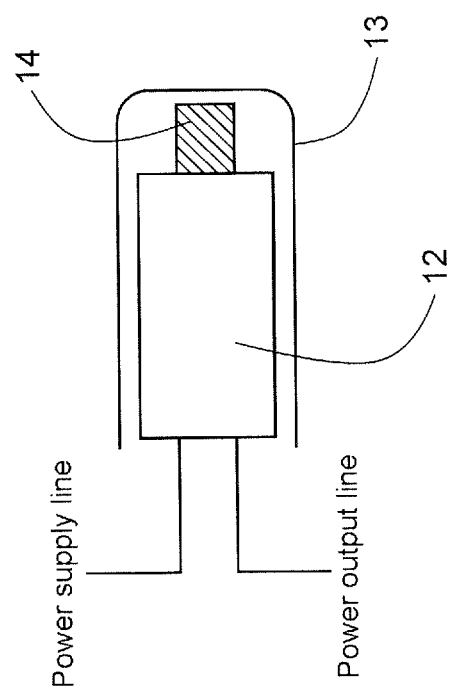
FIG. 18 A schematic diagram of a detection apparatus for a neutron and a γ-ray.

The lithium calcium aluminum fluoride crystal obtained in the example 1 and the comparative example 1 was cut to the length of about 10 mm with a blade saw having a diamond cutting grindstone, and the side surface thereof was processed by grinding in the shape having the length of 10 mm, the width of 2 mm, and the thickness of 1 mm before the crystal was attached to a scintillator unit for neutron detection 14 in the apparatus shown in FIG. 18. In FIG. 18, the symbol 12 represents a photomultiplier and the symbol 13 represents a light shielding material.

Figure 15:
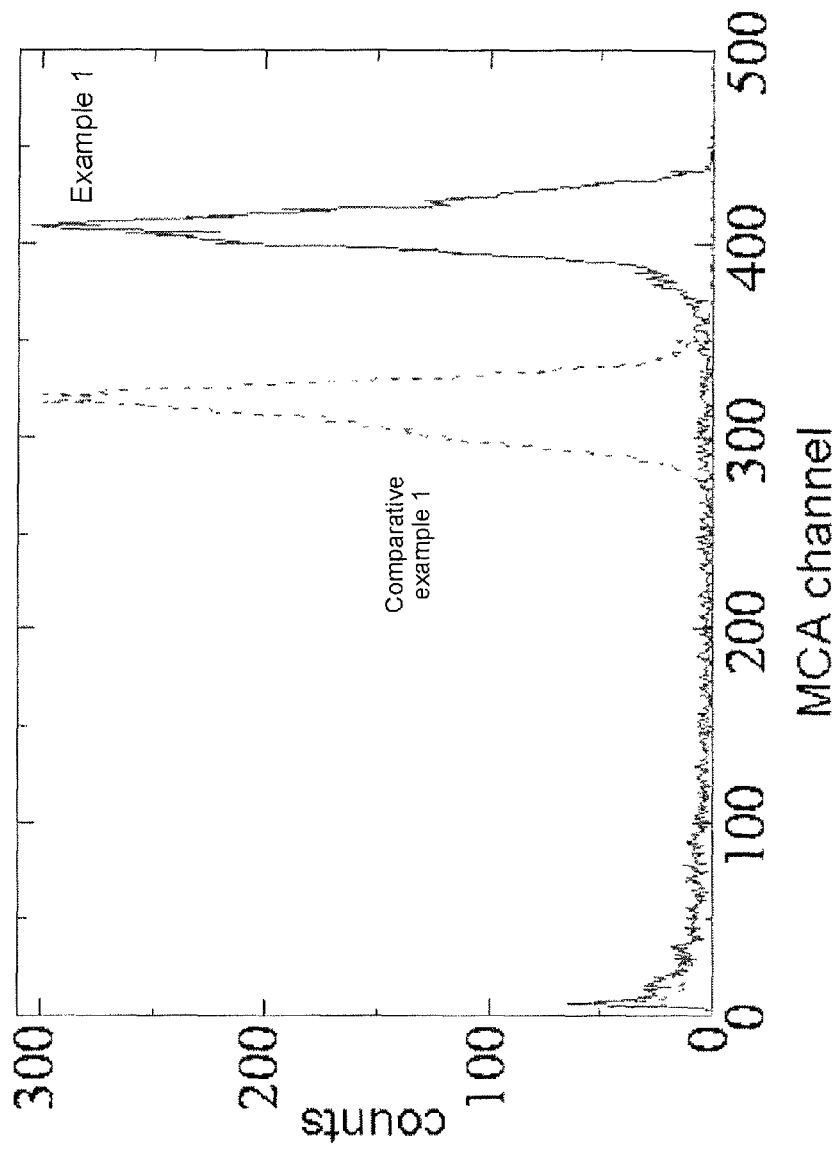
FIG. 15 Comparison results of light emission intensity of the Na- and Eu-doped LiCAF in the example 1 and the Eu-doped LiCAF in the comparative example 1 at the time when a neutron ray is irradiated.

A neutron from 252Cf (polyethylene deceleration, 1 MBq) was applied to the apparatus, and the amount of light emission was measured. The results were shown in FIG. 15. FIG. 15 shows the pulse-height distribution spectrum. The horizontal axis of the pulse-height distribution spectrum represents a crest value of an electric signal, i.e., the amount of light emission of scintillation light, and crest channel values of a multi-channel pulse-height analyzer were shown here. Moreover, the vertical axis represents the frequency of an electric signal showing each crest value, and the number of times (counts) that the electric signal was measured was shown here.

From FIG. 15, it can be seen that the crest value is high in the case where a lithium calcium aluminum fluoride crystal having a low content of $Eu^{2+}$ is used, and the amount of light emission is increased. This is considered because the content of $Eu^{2+}$ is low and there is almost no self-absorption of $Eu^{2+}$.

Figure 16:
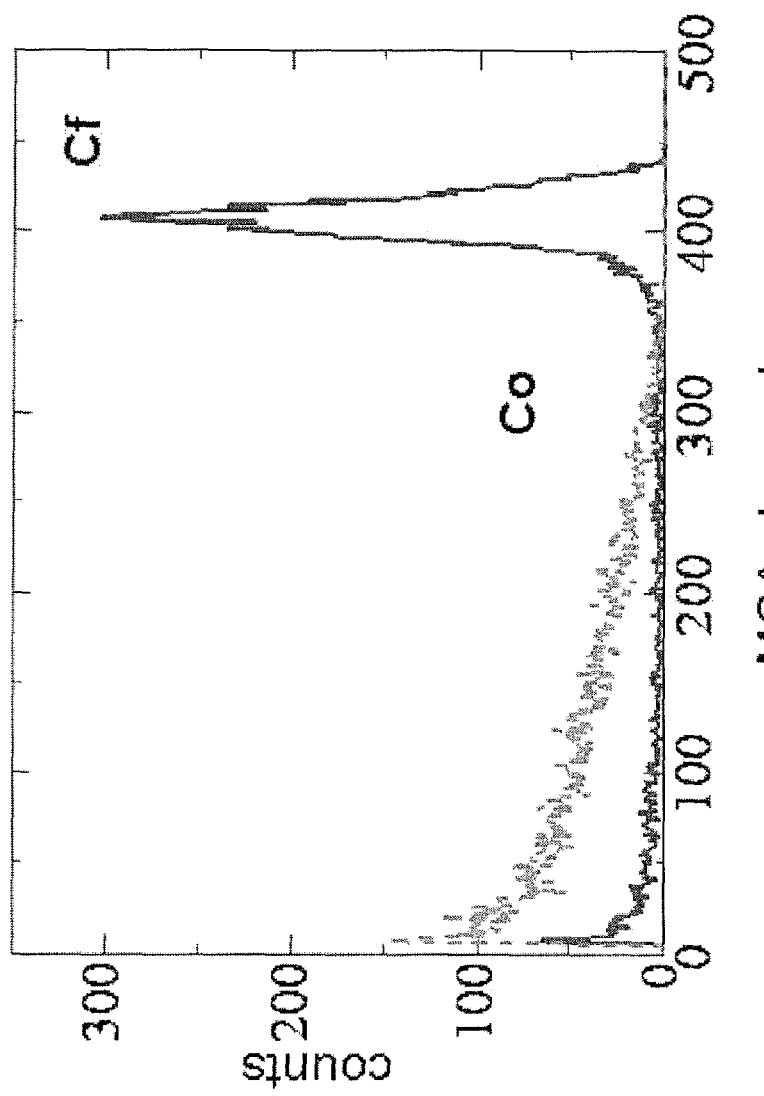
FIG. 16 A diagram showing the n/γ discrimination ability of the Na- and Eu-doped LiCAF in the example 1 at the time when a γ-ray is irradiated and when a neutron ray is irradiated.
Figure 17:
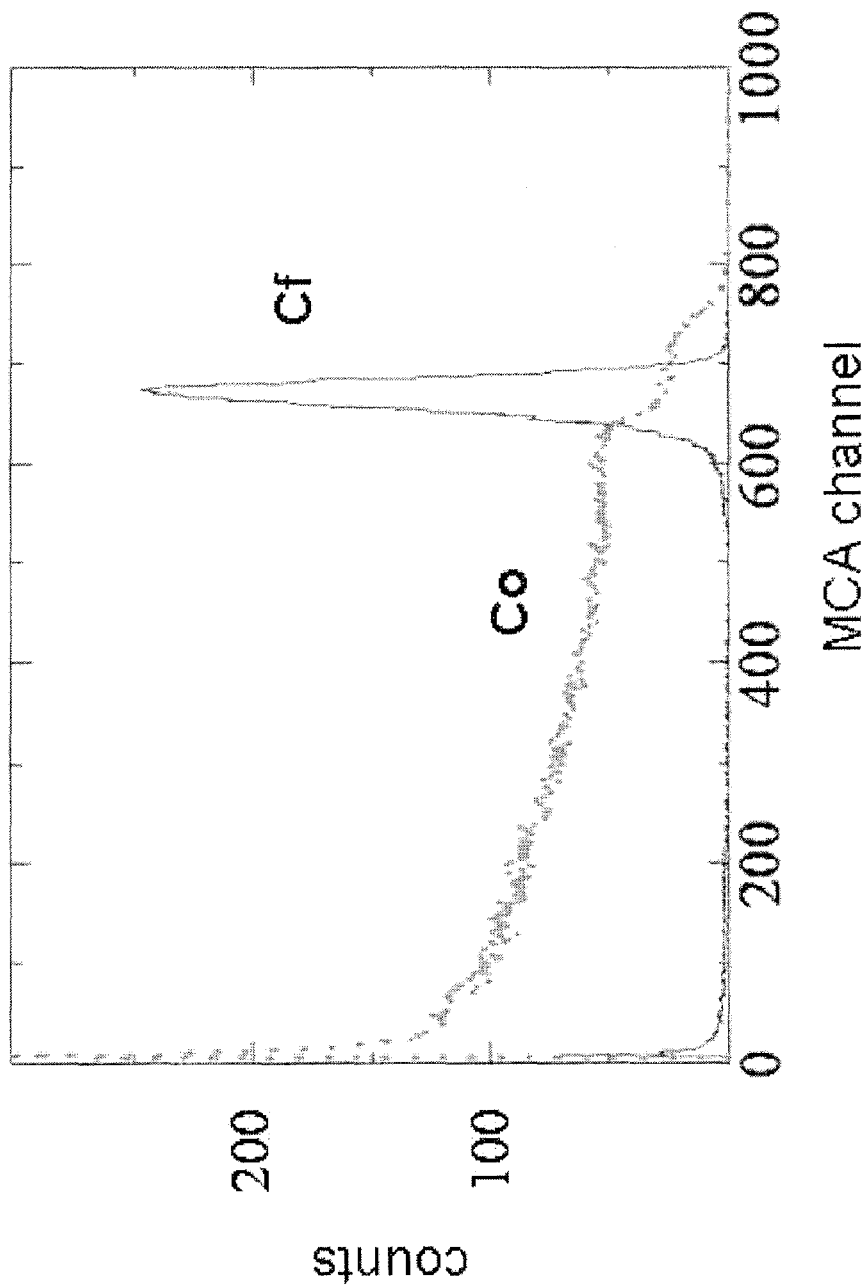
FIG. 17 A diagram showing the n/γ discrimination ability of the Eu-doped LiCAF in the comparative example 1 at the time when a γ-ray is irradiated and when a neutron ray is irradiated.

In addition, the same apparatus was used to apply a γ-ray and measure the amount of light emission with 252Cf being replaced with 60Co. The results obtained by using the crystal obtained in the example 1 were shown in FIG. 16, and the results obtained by using the crystal obtained in the comparative example 1 were shown in FIG. 17. It can be seen that light emission generated by irradiation of a neutron and a γ-ray is observed separately in FIG. 16, and light emission generated by irradiation of a neutron and a γ-ray is observed at the same position in FIG. 17. From the results, it can be seen that the lithium calcium aluminum fluoride crystal having a low content of $Eu^{2+}$ has favorable n/γ discrimination ability.

DESCRIPTION OF REFERENCE NUMERALS 1 after heater
2 heater
3 heat insulation material
4 stage
5 crucible
6 chamber
7 high radio-frequency coil
8 pulling-down rod
9 measurement sample
10 deuterium lamp
11 chamber
12 photomultiplier
13 light shielding material
14 scintillator unit for neutron detection

The invention claimed is:

1. A neutron scintillator, comprising a metal fluoride crystal including a crystal represented by a chemical formula $LiM^1M^2F_6$ wherein Li includes $^6Li$, $M^1$ represents at least one alkaline earth metal element selected from the group consisting of Mg, Ca, Sr, and Ba, and $M^2$ represents at least one metal element selected from the group consisting of Al, Ga, and Sc, the crystal containing not less than 0.02 mol % of Eu, and the crystal having a concentration of $Eu^{2+}$ of less than 0.01 mol %.

2. The neutron scintillator according to claim 1, wherein the Eu contained in the crystal includes $Eu^{3+}$ having a concentration higher than that of the $Eu^{2+}$.

3. The neutron scintillator according to claim 1, wherein a content of a $^6Li$ isotope is not less than 50% of Li.

4. The neutron scintillator according to claim 1, further comprising at least one alkali metal element selected from the group consisting of Na, K, Rb, and Cs.

5. The neutron scintillator according to claim 4, wherein a content of the alkali metal element is not less than 0.001 mol % and not more than 10 mol % with the $LiM^1M^2F_6$ as a reference.

6. A method of producing a neutron scintillator, comprising:
    melting a mixed raw material including an Li-source raw material containing $^6Li$, an alkaline earth metal-source raw material, a metal element-source material, and an Eu-source raw material; and
    growing a metal fluoride crystal including a crystal represented by a chemical formula $LiM^1M^2F_6$ (wherein Li includes $^6Li$, $M^1$ represents at least one alkaline earth metal element selected from the group consisting of Mg, Ca, Sr, and Ba, and $M^2$ represents at least one metal element selected from the group consisting of Al, Ga, and Sc) from the melted mixed raw material in an atmosphere containing a fluorine-source gas broken in a growth atmosphere, the crystal containing not less than 0.02 mol % of Eu, and the crystal having a concentration of $Eu^{2+}$ of less than 0.01 mol %.

7. The method of producing a neutron scintillator according to claim 6, wherein the fluorine-source gas contains a carbonyl fluoride.

8. A method of producing a neutron scintillator, comprising:
    melting a mixed raw material including a Li-source raw material containing $^6Li$, an alkaline earth metal-source raw material, a metal element-source material, an Eu-source raw material, and at least one alkali metal-source raw material selected from the group consisting of a sodium fluoride, a potassium fluoride, a rubidium fluoride, and a cesium fluoride; and
    growing a metal fluoride crystal including a crystal represented by a chemical formula $LiM^1M^2F_6$ (wherein Li includes $^6Li$, $M^1$ represents at least one alkaline earth metal element selected from the group consisting of Mg, Ca, Sr, and Ba, and $M^2$ represents at least one metal element selected from the group consisting of Al, Ga, and Sc) from the melted mixed raw material in an atmosphere containing a fluorine-source gas broken in a growth atmosphere, the crystal containing not less than 0.02 mol % of Eu, the crystal having a concentration of $Eu^{2+}$ of less than 0.01 mol %.

9. The method of producing a neutron scintillator according to claim 8, wherein a content of the alkali metal raw material is not less than 0.001 mol % and not more than 10 mol % with the $LiM^1M^2F_6$ as a reference.

* * * * *